(12) United States Patent
Toyoda

(10) Patent No.: US 7,939,132 B2
(45) Date of Patent: May 10, 2011

(54) FILM PATTERN FORMING METHOD FOR FORMING A MARGIN BAND AND FILLING THE MARGIN BAND

(75) Inventor: Naoyuki Toyoda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 975 days.

(21) Appl. No.: 11/341,653

(22) Filed: Jan. 30, 2006

(65) Prior Publication Data
US 2006/0169672 A1 Aug. 3, 2006

(30) Foreign Application Priority Data

Feb. 1, 2005 (JP) ................................. 2005-024980

(51) Int. Cl.
B05D 5/00 (2006.01)
(52) U.S. Cl. .......... 427/256; 427/595; 427/569; 427/58; 427/299; 427/331; 427/372.2
(58) Field of Classification Search .................. 427/595, 427/569, 58, 256, 299, 331, 372.2
See application file for complete search history.

(56) References Cited

U.S. PATENT DOCUMENTS

| | | | | |
|---|---|---|---|---|
| 6,398,334 | B2 * | 6/2002 | Dunand | 347/14 |
| 6,810,814 | B2 * | 11/2004 | Hasei | 101/485 |
| 2003/0083203 | A1 * | 5/2003 | Hashimoto et al. | 505/100 |
| 2004/0224456 | A1 * | 11/2004 | Abe | 438/200 |

FOREIGN PATENT DOCUMENTS

| | | |
|---|---|---|
| JP | 11-274671 | 10/1999 |
| JP | 2000-278067 A | 10/2000 |
| JP | 2003-133691 A | 5/2003 |
| JP | 2003-149831 A | 5/2003 |
| JP | 2004-000927 A | 1/2004 |
| JP | 2004006700 A * | 1/2004 |
| JP | 2004-103496 | 4/2004 |
| JP | 2004-151428 A | 5/2004 |
| JP | 2004151428 A * | 5/2004 |
| JP | 2005-005676 A | 1/2005 |

OTHER PUBLICATIONS

Translation of JP 2004-141428.*
Chemical Modification of Polymer Surfaces: A Review, Polymers for Advanced Technologies, vol. 5, pp. 809-817, Apr. 29, 1994.*
Machine Translation of JP 2004-006700.*

* cited by examiner

Primary Examiner — Frederick J Parker
Assistant Examiner — Alex Rolland
(74) Attorney, Agent, or Firm — Global IP Counselors, LLP

(57) ABSTRACT

A film pattern forming method is for forming a film pattern on a predetermined region of a substrate that has a predetermined shape. The film pattern forming method includes: rendering a surface of the substrate liquid-repellent; applying droplets of a liquid containing material for forming the film pattern in a margin area of the predetermined region in which the film pattern is to be formed, thereby forming a margin band of the applied droplets and forming a margin band film by drying or hardening the margin band; rendering the surface of the substrate lyophilic; and applying droplets of the liquid in the predetermined region circumscribed by the margin band film and thereby filling the predetermined region.

16 Claims, 21 Drawing Sheets

FILM PATTERN FORMING METHOD FOR FORMING A MARGIN BAND AND FILLING THE MARGIN BAND

BACKGROUND

1. Technical Field

The present invention relates to a film pattern forming method; a film pattern, an insulation film, and a resist film that are manufactured using the film pattern forming method; and a circuit board a semiconductor device, a surface elastic wave device, a surface elastic wave oscillation device, an electro-optic device, and an electronic device that are provided with one of the resist film, the insulation film, and the resist film.

2. Related Art

Semiconductor devices, circuit boards, surface elastic wave devices and the like, in which a laminated layer of a circuit wiring of a film pattern of a conductive body (hereinafter referred to as "wiring film") and a film pattern of an insulation film or the like covering the wiring film is formed on a substrate, are known. Furthermore, film patterns such as resist films are known to be formed and used in the processes of manufacturing these devices. So-called inkjet methods, such as the pattern forming method disclosed in JP-A-No. 11-274671, wherein droplets of a liquid film material (fluid) are discharged from a discharge head, the solvent is removed from the applied liquid material (film material) by drying, and the liquid material is hardened, are known as effective film pattern methods.

A film pattern must be formed with a thickness and flatness required by the target function. In the inkjet methods, for example, as disclosed in JP-A-2004-103496, a flat depressed part having the same shape as the film pattern to be formed is formed by arranging a bank on a substrate so as to circumscribe a predetermined flat film pattern forming region. When droplets of liquid material are discharged toward the depressed part, the bank restricts the applied liquid material from flowing from the film pattern forming region, and from wetting outside film pattern forming region, such that the liquid material sufficiently fills the film pattern forming region. Furthermore, the flat shape of the region filled by the liquid material is the shape delineated by the bank. In this manner, a film pattern having a predetermined shape and thickness is formed by drying or hardening the liquid material filling the concave part.

Since the bank must be arranged so as to circumscribe the film pattern forming region, a problem arises inasmuch as both a film pattern forming region and a bank forming region are required, thus increasing the surface area necessary to form the film pattern. A further problem arises in that, processes and a manufacturing apparatus for forming the bank are also required in addition to the processes for forming the film pattern itself and the manufacturing apparatus for the film pattern itself.

SUMMARY

An advantage of the present invention is to provide a film pattern forming method, film pattern, resist film, insulation film, and circuit board, semiconductor device, surface elastic wave device, surface elastic wave oscillation device, electro-optic device, and electronic device, which are capable of restricting the applied liquid material from flowing from the film pattern forming region and from wetting outside the film pattern forming region so as to be able to form a film pattern having a predetermined pattern shape and thickness without having to require an additional surface area outside the film pattern forming region.

The film pattern forming method of the present invention is a film pattern forming method for forming a film pattern on a predetermined region of a substrate that has a predetermined shape. The method includes rendering a surface of the substrate liquid-repellent; applying droplets of a liquid containing material for forming the film pattern in a margin area of the predetermined region in which the film pattern is to be formed, thereby forming a margin band of the applied droplets and forming a margin band film by drying or hardening the margin band; rendering the surface of the substrate lyophilic; and applying droplets of the liquid in the predetermined region circumscribed by the margin band film and thereby filling the predetermined region.

According to the method of this aspect of the present invention, a margin band of droplets is formed in the margin of the predetermined region by the margin forming process, which forms the margin band film. The droplets for forming the margin band are arranged in the margin area of the predetermined region, and spread from the applied positions bi-directionally in the outward direction and inward direction of the margin area. In a method for applying the droplets in which droplets are applied continuously in the entirety of the margin area, since droplets are applied continuously in the margin area and the predetermined region that is connected to the margin area, the droplets arranged in the margin area then receive the wet-spreading force from the droplets arranged in the predetermined region, and spread only in the outward direction of the margin area from the applied positions. In comparison, by applying the droplets only in the margin area initially, it is possible to reduce the outward direction wet-spreading of the droplets that are applied to the outer periphery of the margin area from the applied positions, as compared to the method in which the droplets are applied continuously over the entirety of the margin area.

Furthermore, by treating the substrate surface with a liquid-repellency process before the margin forming process, droplets applied to the margin part of the margin area have difficulty wet-spreading over the substrate surface. Since the wetting surface area of the droplets is smaller, a greater thickness can be achieved. Therefore, there is less wet-spreading in the outward direction from the applied positions of the droplets applied to the outer periphery of the margin area by the liquid repellency process, as compared to a substrate surface that has not been treated with a liquid repellency process. In conjunction therewith, the formed margin band film can be made thicker.

The margin band film accumulates on the substrate surface and forms a partition circumscribing the predetermined region. Since the droplets filling the predetermined region reduce flow from the margin area with the partition-like margin band film, the droplets sufficiently fill the predetermined region.

Furthermore, the droplets arranged in the predetermined region readily wet-spread the substrate, since a lyophilic process is performed to provide lyophilic treatment to the substrate surface. Since the wet-spreading readily occurs, the droplet shape cannot be maintained and the droplets readily spread and become flat. Accordingly, the arranged droplets thoroughly wet-spread the predetermined region due to the lyophilic process, thus flattening the formed film pattern more as compared to the case where the substrate surface is not treated with the lyophilic process.

Furthermore, the margin band film solidified by drying or hardening does not move or deform despite receiving the force of the wet-spreading droplets applied in the predetermined region, and forms a rigid partition circumscribing the predetermined region. Thus, the liquid filling the predetermined region reliably prevents outflow from the margin area.

In this film pattern forming method, it is preferable that the drying or hardening the margin band be performed by heating or irradiating with light the margin band.

Raising the temperature and irradiating with light advances the drying of the solvent and shortens the reaction time for hardening, and forms the solid margin band film from the liquid margin band more efficiently than the case where temperature elevation or light irradiation is not performed.

In this case, it is preferable that, in rendering the surface of the substrate liquid-repellent, a contact angle relative to water of the surface on which the film pattern is to be formed be made 60 degrees or more.

The surface having a contact angle of 60 degrees or more relative to water makes the wet-spreading of the applied liquid difficult, such that the applied droplets wet-spread a smaller surface area and are thicker. Accordingly, setting the contact angle of the substrate surface relative to water at 60 degrees or higher reduces the wet-spreading by the droplets in the outward direction of the margin area, and thickens the formed margin band film.

In this case, it is preferable that, in rendering the surface of the substrate lyophilic, a contact angle relative to water of the surface on which the film pattern is to be formed be 30 degrees or less.

The surface which has the contact angle of 30 degrees or less relative to water has excellent wettability relative to the applied liquid. This, the applied liquid can wet-spread preferably in the predetermined region. Since the wet-spreading readily occurs, the droplet shape cannot be maintained and the droplets readily spread and become flat. Accordingly, the applied droplets thoroughly wet the predetermined region, and the formed film pattern is flattened.

In this case, it is preferable that the rendering of the surface of the substrate liquid repellent include executing a lyophilic process or a liquid repellency process on the surface of the substrate as a preparation process; and adjusting a contact angle relative to water of the surface on which the film pattern is to be formed such that the contact angle is higher than a predetermined contact angle, by executing a liquid repellency process when the lyophilic process has been executed as the preparation process, and executing a lyophilic process when the liquid repellency process has been executed as the preparation process.

In the preparation process, the surface of the substrate can be rendered as lyophilic as can be achieved with a lyophilic treatment. By rendering the surface most lyophilic, the contact angle of the substrate surface after the preparation process becomes a constant value, which can be known by measuring beforehand. Then, the contact angle can be increased by performing a liquid repellency process in the adjustment process. In this manner, a desired contact angle can be easily realized by increasing the contact angle from the known contact angle as of the end of the preparation process. Similarly, the substrate surface can be subjected to a liquid repellency process as the preparation process. Then, the contact angle can be decreased by performing a lyophilic process in the adjustment process. In this manner, a desired contact angle can be easily realized by decreasing the contact angle from the known contact angle as of the end of the preparation process.

In this case, it is preferable that the liquid repellency processes be a process of forming a thin organic film of organic molecules containing fluorine on the surface of the substrate.

A liquid-repelling layer is formed on the surface on which the film pattern is to be formed, such that the contact angle of the surface can be adjusted so as to have more liquid repellency.

In this case, it is preferable that the liquid repellency process be a process of treating the surface of the substrate with a plasma processing using a fluorocarbon compound as a reaction gas.

The surface on which the film pattern is to be formed is adjusted so as to have more liquid repellency, and the contact angle of the surface can be adjusted so as to have more liquid repellency.

In this case, it is preferable that the liquid repellency process be a process of forming on the surface of the substrate a liquid-repelling film by applying a macromolecular compound containing fluorine.

A liquid-repelling film is formed on the surface on which the film pattern is to be formed, and the contact angle of the surface can be adjusted so as to have more liquid repellency.

In this case, it is preferable that the lyophilic process is a process of irradiating the surface of the substrate with ultraviolet light.

The surface on which the film pattern is to be formed is adjusted so as to be more lyophilic, and the contact angle of the surface can be adjusted so as to be more lyophilic.

In this case, it is preferable that the lyophilic process be a process of treating the surface of the substrate by a plasma processing using oxygen as a reaction gas.

The surface on which the film pattern is to be formed is adjusted so as to be more lyophilic, and the contact angle of the surface can be adjusted so as to be more lyophilic.

In this case, it is preferable that the lyophilic process be a process of treating the surface of the substrate with an acid or alkali processing.

A lyophilic layer is formed on the surface on which the film pattern is to be formed, and the contact angle of the surface can be adjusted so as to be more lyophilic.

In this case, it is preferable that the margin band be formed of the droplets that are aligned linearly, with the droplets being in contact with each other.

Since the surface area of the margin band can be small, a margin band can be formed even in a narrow margin area. Furthermore, the time required for forming the margin band can be reduced.

In this case, it is preferable that the forming of the margin band and the hardening or drying of the margin band be executed a plurality of times in an alternating manner to form a laminated margin band film.

Since the height of the margin band film can be made higher, a thicker film pattern can be formed, such that more liquid can fill the predetermined region.

In this case, it is preferable that a viscosity of the liquid used in forming the margin band be higher than a viscosity of the liquid used in filling the predetermined region.

The liquid preferably has a high viscosity in order to form a higher margin band or margin band film by restricting the spread of the droplets from the applied position. It is, however, desirable that the liquid have a low viscosity in order to fill the entirety of the region with the liquid. Accordingly, the viscosity of the liquid must be a value that satisfies both conditions. By making the viscosity of the liquid used in the margin forming higher than the viscosity of the liquid used in the filling of the predetermined region, it becomes unnecessary to reduce the viscosity of the liquid used in the forming of the margin band to allow the liquid to be used in filling the entirety of the region. Thus, a liquid having a higher viscosity can be used as compared to the case where liquids having the same viscosity are used in both processes. Similarly, it is unnecessary to increase the viscosity of the liquid used in the filling of the predetermined region in order to form a higher margin band or margin band film. Instead, a liquid having a lower viscosity can be used in the filling of the predetermined region.

In this case, it is preferable that a volume per droplet applied during the forming of the margin band be less than a volume per droplet applied during the filling of the predetermined region.

The greater the volume, the greater the surface area wetted by the applied droplet. The volume of the droplet is preferably small in order to restrict the spread of the droplet from the applied position. However, a droplet of higher volume is desirable in order to more effectively fill the region with the liquid. Accordingly, the volume of the liquid must be a value that satisfies both conditions. By decreasing the volume of the droplets used in the margin forming process so as to be less than the volume of the droplets used in the filling process, it becomes unnecessary to increase the volume of the droplet in order to more effectively fill the entirety of the region. Droplets having a smaller volume can be used as compared to the case where droplets having the same volume are used in both processes. Similarly, it is unnecessary to decrease the volume of the droplets used in the filling of the predetermined region in order to restrict the spread of the droplet from the applied position, and a droplet having a lower volume can be used in forming the margin band. In this way the volume of the droplet may be selected so as to easily restrict the spread of the droplet from the applied position, and a volume of the droplet may be selected so as to easily and effectively fill a region. Thus, a film pattern can be formed more effectively with little excess spreading.

The film pattern of another aspect of the present invention is characteristically formed using the above described film pattern forming method.

A film pattern can be formed to a predetermined pattern shape and thickness while restricting the applied liquid from flowing from the film pattern forming region and preventing wetting outside the film pattern forming region, and a film pattern formed by this film pattern forming method realizes a film pattern of ideal pattern shape and thickness that both covers necessary parts and does not cover unnecessary parts.

The resist film of still another aspect of the present invention is characteristically formed using the above described film pattern forming method.

A resist film can be formed to a predetermined pattern shape and thickness while restricting the applied liquid from flowing from the film pattern forming region and preventing wetting outside the film pattern forming region, and a resist film formed by this film pattern forming method realizes a film pattern of ideal pattern shape and thickness that both covers necessary parts and does not cover unnecessary parts.

The insulation film of still another aspect of the present invention is characteristically formed using the above described film pattern forming method.

An insulation film can be formed to a predetermined pattern shape and thickness while restricting the applied liquid from flowing from the film pattern forming region and preventing wetting outside the film pattern forming region, and an insulation film formed by this film pattern forming method realizes a film pattern of ideal pattern shape and thickness that both covers necessary parts and does not cover unnecessary parts.

The method for manufacturing a surface elastic wave device of still another aspect of the present invention includes forming a resist film using the film pattern forming method of Claim 1 on a part of a surface of the surface elastic wave device that is not treated with an anodic oxidation process; and executing the anodic oxidation process on the surface of the surface elastic wave device.

A film pattern can be formed to a predetermined pattern shape and thickness while restricting the applied liquid from flowing from the film pattern forming region and preventing wetting outside the film pattern forming region, and a film pattern formed by this film pattern forming method realizes a resist film of ideal flatness and thickness that both protects surfaces that are not treated by the anodic oxidation process and does not affect surfaces that are treated by the anodic oxidation process. In this way, an ideal surface elastic wave device is realized which has ideal surfaces treated by anodic oxidation and surfaces untreated by anodic oxidation.

The surface elastic wave device of the present invention is formed by performing anodic oxidation after the above described resist film has been formed.

A film pattern can be formed to a predetermined pattern shape and thickness while restricting the applied liquid from flowing from the film pattern forming region and preventing wetting outside the film pattern forming region, and a film pattern formed by this film pattern forming method realizes a resist film of ideal flatness and thickness that both protects surfaces that are not treated by the anodic oxidation process and does not affect surfaces that are treated by the anodic oxidation process. In this way, an ideal surface elastic wave device is realized which has ideal surfaces treated by anodic oxidation and surfaces untreated by anodic oxidation.

The surface elastic wave device of the present invention is formed by performing etching after the above described resist film has been formed.

A film pattern can be formed to a predetermined pattern shape and thickness while restricting the applied liquid from flowing from the film pattern forming region and preventing wetting outside the film pattern forming region, and a film pattern formed by this film pattern forming method realizes a resist film of ideal flatness and thickness that both covers parts of the film excluded from the etching and parts of the film not excluded from the etching. In this way, an ideal surface elastic wave device can be realized which has an ideal film pattern formed by etching.

The method for manufacturing a semiconductor device of still another aspect of the present invention has forming an insulation film for insulating between a conductive film and semiconductive film, or between mutually conductive films using the above described film pattern forming method.

A film pattern can be formed to a predetermined pattern shape and thickness while restricting the applied liquid from flowing from the film pattern forming region and preventing wetting outside the film pattern forming region, and a film pattern formed by this film pattern forming method realizes a semiconductor device manufacturing method capable of manufacturing an ideal semiconductor device realizing an ideal insulation between mutually conductive films or between a conductive film and a semiconductive film, by providing an insulation film of ideal pattern shape and thickness that both covers necessary parts and does not cover unnecessary parts.

The semiconductor device of still another aspect of the present invention has a substrate; a first conductive film formed on the substrate; the above described insulation film formed on the first conductive film; and a second conductive film or a semiconductive film formed on the insulation film.

An insulation film can be formed to a predetermined pattern shape and thickness while restricting the applied liquid from flowing from the film pattern forming region and preventing wetting outside the film pattern forming region, and an insulation film formed by this film pattern forming method realizes a high-performance semiconductor device realizing an ideal insulation between mutually conductive films or between a conductive film and a semiconductive film by providing an insulation film of ideal pattern shape and thickness that both covers necessary parts and does not cover unnecessary parts.

The method for manufacturing a circuit board of still another aspect of the present invention has forming an insulation film for insulating between mutually conductive films using the above described film pattern forming method.

A film pattern can be formed to a predetermined pattern shape and thickness while restricting the applied liquid from flowing from the film pattern forming region and preventing wetting outside the film pattern forming region, and an insulation film formed by this film pattern forming method realizes a circuit board manufacturing method capable of manufacturing a circuit board realizing ideal insulation between mutually conductive films by having an insulation film of ideal pattern shape and thickness that both covers necessary parts and does not cover unnecessary parts.

The circuit board of still another aspect of the present invention has a substrate; an insulation film formed on the substrate using the above described method; and a conductive film formed on the insulation film.

A film pattern can be formed to a predetermined pattern shape and thickness while restricting the applied liquid from flowing from the film pattern forming region and preventing wetting outside the film pattern forming region, and a film pattern formed by this film pattern forming method realizes a high-performance circuit board realizing ideal insulation between mutually conductive films by an insulation film of ideal pattern shape and thickness that both covers necessary parts and does not cover unnecessary parts.

The surface elastic wave oscillation device of still another aspect of the present invention is provided with the above described surface elastic wave device.

An ideal surface elastic wave oscillation device is realized having an ideal surface elastic wave device with ideal surfaces treated with anodic oxidation and surfaces untreated by anodic oxidation, and an ideal surface elastic wave device with an ideal film pattern formed by etching using an etched resist layer.

The electro-optic device of still another aspect of the present invention is provided with the above described film pattern.

A high-performance electro-optic device is realized by providing a film pattern of ideal pattern shape and thickness, and by realizing functions through this film pattern.

The electro-optic device of still another aspect of the present invention is provided with the above described semiconductor device.

A high-performance electro-optic device is realized by realizing ideal insulation between mutually conductive films or between a conductive film and a semiconductive film by providing a high-performance semiconductor device realized with ideal insulation between mutually conductive films or between a conductive film and a semiconductive film.

The electro-optic device of still another aspect of the present invention is provided with the above described circuit board.

A high-performance electro-optic device realizing ideal insulation between mutually conductive films is provided with a high-performance circuit board realized by ideal insulation between mutually conductive films.

The electronic device of still another aspect of the present invention is provided with either the above described surface elastic wave oscillation device or the above described electro-optic device.

The structure of the present invention realizes a high-performance electronic device by installing an ideal surface elastic wave oscillation device or high-performance electro-optic device.

DESCRIPTION OF EXEMPLARY EMBODIMENTS

Embodiments of the film pattern forming method of the present invention are described below with reference to the drawings. The reduced scale of each part and each layer is suitably modified in the following drawings so as to present the parts and layers at a size that facilitates understanding.

Figure 1:
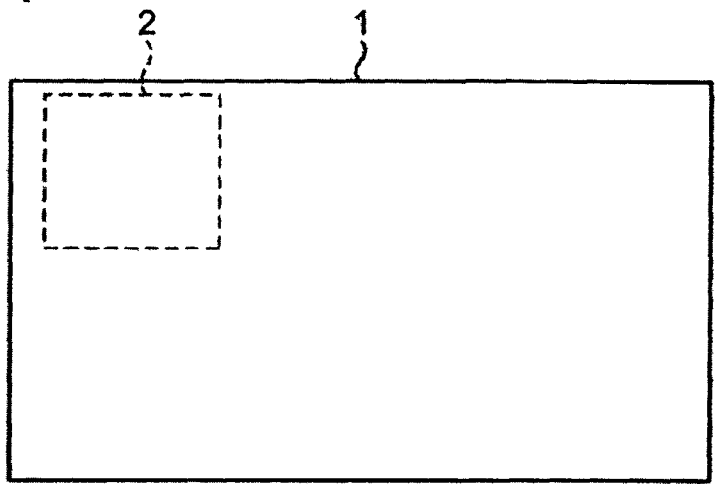
FIG. 1 are schematic plan views showing the film pattern forming method of the first embodiment.
Figure 1:
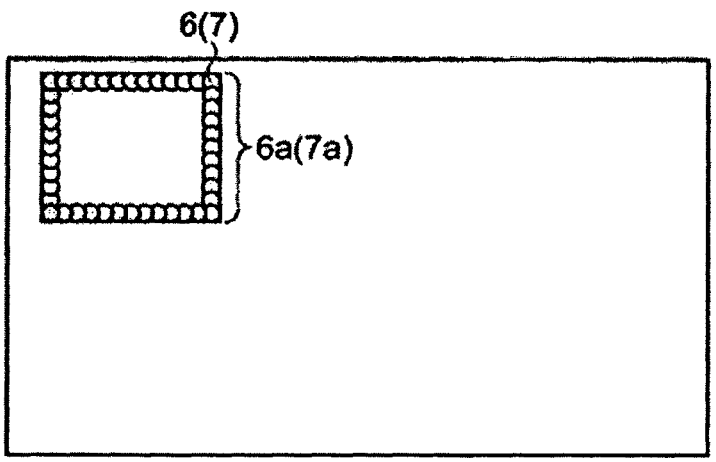
Figure 1:
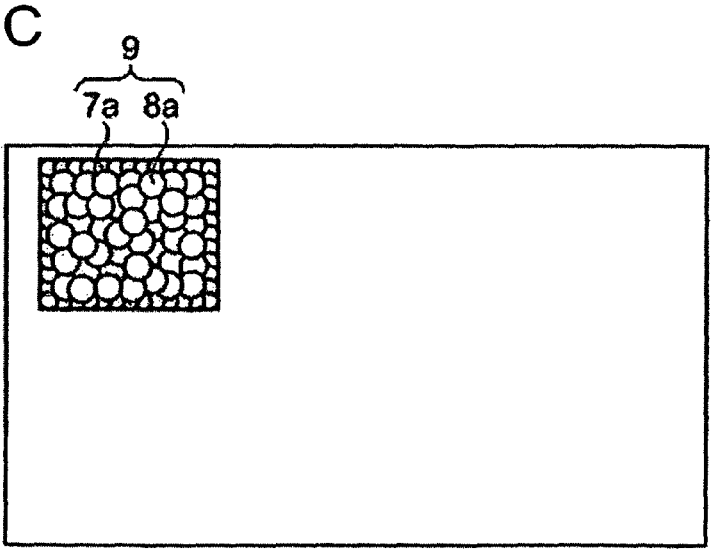
Figure 2:
FIG. 2 are schematic section views illustrating the film pattern forming method.
Figure 2:
Figure 2:
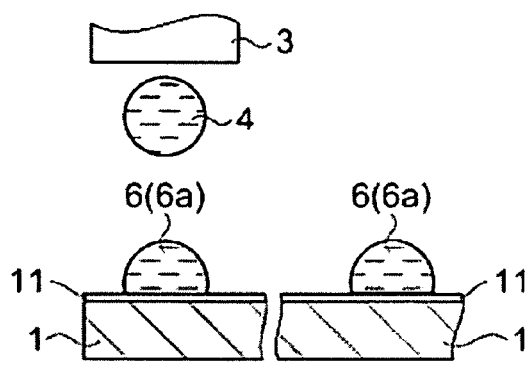
Figure 2:
Figure 2:
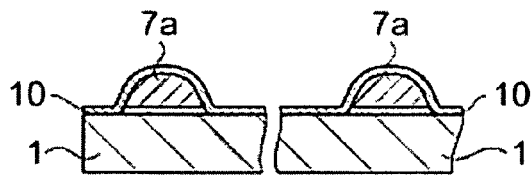
Figure 2:
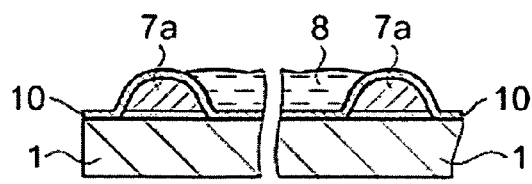
Figure 2:
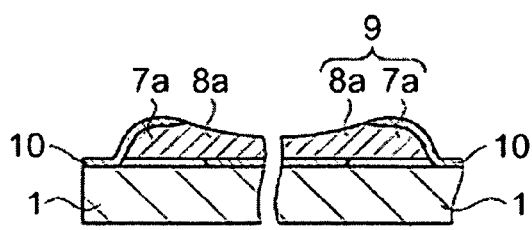

FIG. 1 is a schematic plan view showing the film pattern forming method of the first embodiment. FIG. 2 is a schematic cross section view showing the film pattern forming method of the present embodiment. A substrate 1 shown in FIG. 1 is a liquid crystal substrate of, for example, a surface elastic wave device. An example is described wherein a resist film 9 is formed in a region 2 indicated by the dashed lines in FIG. 1A. Region 2 corresponds to a margin area, and a resist film 9 corresponds to a resist film and film pattern.

First, the surface of the substrate 1 is subjected to a lyophilic process to form a lyophilic film 10 on the surface including the region 2, as shown in FIG. 2A. Then, the surface of the substrate 1 is subjected to a liquid repellency process to mitigate lyophilic property of the lyophilic film 10 and form a liquid-repelling film 11, as shown in FIG. 2B. The thickness of the lyophilic film 10 and liquid-repelling film 11 is approximately a one-molecule layer. Next, a liquid material (liquid) for forming a resist film 9 is discharged as droplet 4 from a droplet discharge head 3, and is applied to the surface of the substrate 1, as shown in FIG. 2C. The applied droplet 4 becomes droplet 6, the size of which is regulated by the wetting properties of the liquid material on the surface of the substrate 1, and is arranged on the substrate 1. A process for executing the lyophilic process to form the lyophilic film 10 corresponds to the preparation process, and a process for executing the liquid repellency process to mitigate the lyophilic property of the lyophilic film 10 and form the liquid-repelling film 11 corresponds to the adjustment process. The liquid material corresponds to the liquid.

The lyophilic process and liquid repellency process are processes for shifting the contact angle (wetting) of the droplet 4 (liquid) arranged on the substrate 1 in the lyophilic direction or liquid-repelling direction, such that the contact angle after such processing is dependent on the executed lyophilic process or liquid repellency process, and the contact angle prior to such processing. However, there are cases in which the contact angle may differ due to differences in the installation environment even when the substrate surface is made of identical material, and the contact angle prior to processing may differ even when the substrate surface is made of identical material. The preparation process is a process for achieving a contact angle at a fixed value prior to the adjustment process in order to shift the contact angle during the following adjustment process to attain a target contact angle. The preparation process of the present embodiment is a process for forming a lyophilic film 10, and the contact angle relative to water, for example, is set to a fixed value, for example, 10 degrees, in a range of 0 degrees to 10 degrees. Details of the lyophilic process are described later.

As described above, the shape of the droplet 6, which is obtained when the droplet 4 has impinged the surface of the substrate 1, is regulated by the wetting of the liquid on the surface of the substrate 1. For example, a liquid material containing 20% phenol novolac resin as a solid has a superior wetting area on a surface when the contact angle relative to water is less than 30 degrees, and the droplet 6 weighing approximately 10 nano grams wets a wide area and the droplet loses its shape and its height is difficult to measure. In order to set the shape of the droplet 6 so as to form a margin band film 7a having a height sufficient that a region circumscribed by the margin band film 7a is filled by the liquid material to a sufficient thickness, the contact angle of the surface of the substrate 1 relative to the liquid material is preferably large, the contact angle relative to water being 60 degrees or more, and ideally 80 degrees or more. In the process for forming the liquid-repelling film 11, for example, the contact angle relative to water is 80 degrees. Details of the liquid repellency process are described later.

The droplets 6 are arranged in a single row at equal distances so as to partially mutually overlap on the margin part of the region 2, as shown in FIG. 1B. The mutually partially overlapping droplets 6 are integratedly unified as a single body, and form a band-like margin band 6a on the margin part of the region 2. Next, the margin band 6a is dried or hardened and becomes a margin band film 7a, as shown in FIG. 2D. A process of drying the margin band 6a or a process of promoting the hardening of the margin band 6a is performed when natural drying or natural hardening is slow.

The process of drying the margin band 6a may involve, for example, heating so as to evaporate the solvent. The process for promoting the hardening of the margin band 6a may involve, for example, irradiating the margin band 6a with light to promote hardening when the liquid material is a photosetting material. As example, heating of the substrate 1 may be accomplished by a process using a normal hotplate, electric heater or the like, or by lamp annealing. The light source of the light used for lamp annealing is not specifically limited, however, light sources such as an infrared lamp, xenon lamp, YAG laser, argon laser, carbon dioxide gas laser, XeF, XeCl, XeBr, KrF, KrCl, ArF, ArCl, and like excimer lasers may be used as light sources.

Next, a lyophilic process is performed on the surface of the substrate 1 on which the margin band film 7a is formed, so as to form a lyophilic film 10, as shown in FIG. 2E. As described above, the shape of the droplet 6, which is formed by the droplet 4 that has impinged the surface of the substrate 1, is regulated by the wetting of the surface of the substrate 1 by the liquid material. For example, a liquid material containing 20% phenol novolac resin as a solid has a superior wetting area on a surface when the contact angle relative to water is less than 30 degrees, and the droplet 6 weighing approximately 10 nano grams wets a wide area and the droplet loses its shape and its height is difficult to measure. In order to obtain a better wetting area by the droplet 6 the contact angle is desirably reduced relative to he liquid material on the surface of the substrate 1, so as to be less than 30 degrees, and ideally less than 10 degrees. In the process for executing the lyophilic process to form a lyophilic film 10, the contact angle relative to water is 10 degrees. The process for executing the lyophilic process corresponds to the lyophilic process.

Next, droplets 4 are discharged within the region circumscribed by the margin band film 7a, and the droplets 6, that is, the liquid material, fills the region circumscribed by the margin band film 7a. Since the droplets 4 impinging the surface at a contact angle relative to water of less than 30 degrees produce excellent wetting, the droplets 6 are not formed in the shape shown in FIG. 2C, and a center film 8 is formed by the liquid material wetting and filling the region circumscribed by the margin band film 7a, as shown in FIG. 2F. The liquid material forming the center film 8 does not have the granular shape of the droplet 4 and wets in a flattened plate-like shape. Furthermore, the applied and flattened droplet 4 wets and spreads so as to fill the gaps between the applied and flattened droplets 4.

As shown in FIGS. 1C and 2G, a center film 8a is formed by drying or hardening the liquid material constructing the filled center film 8, and a resist film 9 is formed by the margin band film 7a and the center film 8a. During the time the filled liquid material is naturally dried or naturally hardened, a process may be performed to promote the drying or hardening. When the liquid material is solidified by drying or hardening, the thickness of the center film 8a is less than the thickness of the margin band film 7a when the volume of the liquid material is reduced.

Although the liquid material formed in the center film 8a has been drawn in a granular shape in order to display the filled state of the discharged droplets 4 in FIG. 1C, the applied droplets 4 become integratedly unified such that the center film 8 is a single film of uniform thickness, and the dried or hardened center film 8a is also a single film of uniform thickness.

The display process method for obtaining a suitable contact angle for forming a resist film 9 on the surface of a substrate is described below. First, the method for subjecting the surface of the substrate 1 to a liquid repellency process is described. One method of liquid repellency processing is the method for forming a self-assembling film, such as an organic molecular film, on the surface of the substrate. Organic molecular films for processing a substrate surface have a functional group at one end capable of bonding to the substrate, and have a functional group at the other end that modifies (controls the surface energy) the surface of the substrate so as to have a liquid-repelling property, and are provided with linear carbon atoms, or partly branched carbon atom chain linked to the functional groups, such that bonding to the substrate occurs by self-assembly and produces a molecular film, for example, a monomolecular film.

A self-assembling film is configured by structural atoms of the under layer, such as a substrate or the like, reactive bonding functional groups capable, other normal molecules, and the films are formed by orienting the compounds having extremely high orientation properties by mutual interactions of the normal molecules. Since a self-assembling film is formed by orienting monomolecules, the formed film is extremely thin and uniform at the molecular level. That is, since identical molecules are positioned on the surface of the film, the film surface is not only uniform, it also has excellent liquid repellency.

When, for example, fluoroalkylsilane is used as a compound having high orientation properties, uniform liquid repellency is obtained on the surface of the film since a self-assembly film is formed with each compound oriented so as to have the fluoroalkyl group positioned on the surface of the film.

Examples of useful compounds for forming self-assembling films include fluoroalkylsilanes (hereinafter referred to as "FAS") such as heptadecafluoro-1,1,2,2tetrahydrodecyltriethoxysilane, heptadecafluoro-1,1,2,2tetrahydrodecyltrimethoxysilane, heptadecafluoro-1,1,2,2tetrahydrodecyltrichlorosilane, tetradecafluoro-1,1,2,2tetrahydrooctyltriethoxysilane, tridecafluoro-1,1,2,2tetrahydrooctyltrimethoxysilane, tridecafluoro-1,1,2,2tetrahydrooctyltrichlorosilane, trifluoropropyltrimethoxysilane, and the like. It is preferable that these individual compounds are used singly, however, two or more compounds may be used in combination.

FAS can be represented by the general structural formula $RnSiX_{(4-n)}$. Where n represents an integer between 1 and 3 inclusive, and X represents a hydrolytic group, such as methoxy group, ethoxy group, halogen atom or the like. R represents a fluoroalkyl group, and has a structure of $(CF_3)$ $(CF_2)x(CH_2)y$ (where x represents an integer between 0 and 10 inclusive, y represents an integer between o and 4 inclusive); when a plurality of R and X bonds to Si, the R or X may all be the same or may all be different. The hydrolytic group represented by X forms silanol by hydrolysis, and the silanol reacts with the hydroxyl group of the under layer, such as the substrate 1 (glass, silicon), and bonds to the substrate by siloxane bonds. Since R has a fluoro group, such as $(CF_3)$, on the surface, it modifies the surface to prevent wetting of the under layer surface of the substrate (low surface energy).

The self-assembling film configured by an organic molecular film is formed on the substrate by placing the raw material compounds together with the substrate in a sealed vessel and storing at room temperature for 2~3 days. Furthermore, the film is formed on the substrate by maintaining the entire sealed vessel at 100° C. for approximately 3 days. The process of forming a self-assembling film by storing the raw material compound and substrate in the same sealed vessel corresponds to the process for forming an organic thin film configured by organic molecules containing fluorine atoms on the surface of the substrate.

Although a method for forming a self-assembling film from the gaseous phase is described above, the self-assembling film may also be formed from the liquid phase. For example, the substrate 1 may be immersed in a liquid containing the raw material compound, washed, and dried to form a self-assembling film on the substrate. The process for forming a self-assembling film by immersing the substrate 1 in a liquid containing the raw material compound, then washing the substrate corresponds to the process for forming a liquid-repelling film by applying a macromolecular compound containing fluorine atoms on the surface of the substrate.

Other methods for performing a liquid repellency process involve plasma irradiation at normal temperature. The type of gas used in plasma processes can be selected after considering the properties of the surface material of the substrate. For example, fluorocarbon gases such as tetrafluoromethane, perfluorohexane, perfluorodecane and the like may be used as the processing gas. In this case, a liquid-repelling fluoride polymer film can be formed on the surface of the substrate. The processing conditions of the plasma processing methods using tetrafluoromethane as the processing gas ($CF_4$ plasma processing method) include, for example, 50~1000 W plasma power, tetrafluorocarbon gas flow rate of 50~100 mL/min, substrate transport speed of 0.5~1020 mm/sec relative to the plasma discharge electrode, and substrate temperature of 70~90° C. Details of the plasma process apparatus using the $CF_4$ plasma process are described later.

First, the method for subjecting the surface of the substrate 1 to a lyophilic process is described. The liquid repellency is mitigated by performing a lyophilic process on the surface of the substrate 1, which has a higher degree of liquid repellency than the previously stated contact angle. Lyophilic processing can be accomplished by methods employing radiation by ultraviolet light at a wavelength of 170~400 nm. In this way the liquid-repelling film can be uniformly broken either locally or over the entirety of the surface, thus mitigating the liquid repellency. In this case, although the degree of mitigation of the liquid repellency can be adjusted by the irradiation time of the ultraviolet light, such adjustment can also be accomplished by combinations of the intensity and wavelength of the ultraviolet light, and thermal processing (heating).

Other methods of lyophilic processing include $O_2$ plasma processing using oxygen as the reaction gas. The $O_2$ plasma process irradiates a substrate P with oxygen in a plasma state from a plasma discharge electrode. An example of the conditions for the $O_2$ plasma process includes 50~1000 W plasma power, oxygen gas flow rate of 50~100 mL/min, and relative moving speed of the substrate 1 of 0.5~10 mm/sec relative to the plasma discharge electrode, and substrate temperature of 70~90° C. In this way the liquid-repelling film can be uniformly modified either locally or over the entirety of the surface, thus mitigating the liquid repellency. Details of the plasma process apparatus using the $O_2$ plasma process are described later.

Another method of lyophilic processing involves exposure of the substrate 1 to an ozone atmosphere. In this way the liquid-repelling film can be uniformly modified either locally or over the entirety of the surface, thus mitigating the liquid repellency. In this case, the degree of the mitigation of the liquid repellency can be adjusted by the irradiation power, distance, and time.

Still another method of lyophilic processing involves treating the substrate 1 with acid or alkali. The liquid-repelling film formed on the surface of the substrate 1 can be locally broken down to mitigate the liquid repellency by treating the surface of the substrate 1 with acid or alkali. The partial breakdown can occur uniformly over the entire surface of the processed substrate 1 so as to mitigate the liquid repellency of the entire surface.

The liquid repellency processing method used in the present embodiment is a plasma process using tetrafluoromethane as the processing gas ($CF_4$ plasma process), and the lyophilic processing method used is irradiation by ultraviolet light at a wavelength of approximately 250 nm. Although the lyophilic process of irradiation by ultraviolet light modifies the lyophilic side of the treated surface and does not form a new lyophilic film, the concept includes the lyophilic film 10 in the modified surface. Similarly, although the $CF_4$ plasma process modifies the liquid-repelling side of the treated surface and does not form a new liquid-repelling film, the concept includes the liquid-repelling film 11 in the modified surface.

Figure 3:
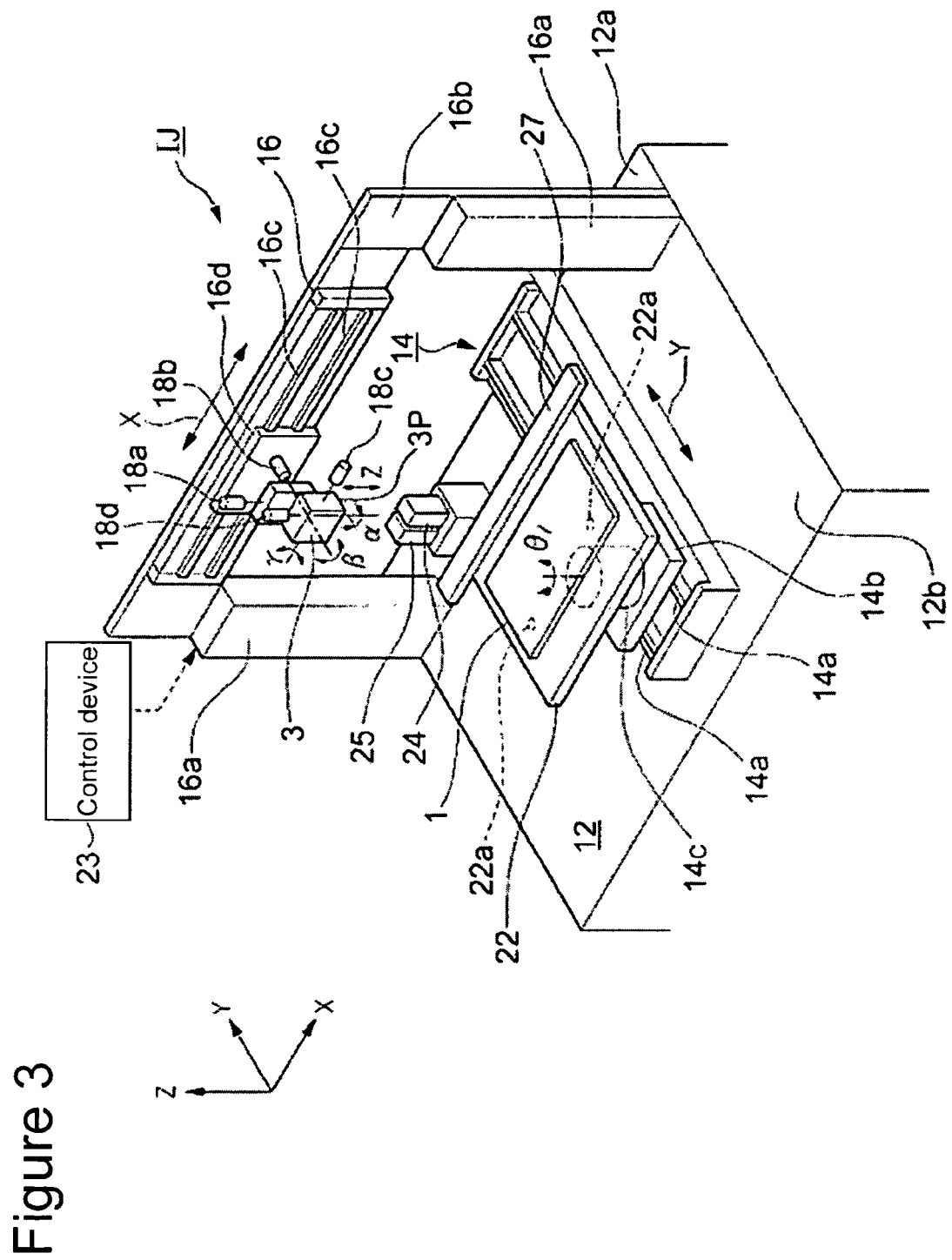
FIG. 3 is a perspective view briefly showing the structure of the droplet discharge device.

The device manufacturing apparatus used when manufacturing the device of the present invention is described below. A droplet discharge device (inkjet device) for manufacturing devices by discharging (dropping) droplets from a droplet discharge head onto a substrate is used as the device manufacturing apparatus. FIG. 3 is a perspective view briefly showing the structure of the droplet discharge device.

As shown in FIG. 3, a droplet discharge apparatus IJ is provided with base 12, substrate stage 22 for supporting the substrate 1 and provided on top of the base 12, a first moving device (moving device) 14 for movably supporting the substrate stage 22, droplet discharge head 3 for discharging droplets of liquid material onto a substrate 1 supported on the substrate stage 22, second moving device 16 for movably supporting the droplet discharge head 3, and control device 23 for controlling the droplet discharge operation of the droplet discharge head 3. The droplet discharge apparatus IJ is further provided with an electronic balance (not shown in the drawing) as a weight measuring device provided on the base 12, capping unit 25, and cleaning unit 24. The operation of the droplet discharge apparatus IJ including the first moving device 14 and second moving device 16 is described below.

The first moving device 14 is installed on top of the base 12, and is positioned along the Y direction. The second moving device 16 is mounted upright relative to the base 12 using two columns 16a, and is mounted at the back part 12a of the base 12. The X direction (second direction) of the second moving device 16 is perpendicular to the Y direction (first direction) of the first moving device 14. The Y direction is the direction along the direction of the front part 12b and back part 12a of the base 12. Conversely, the X direction is the direction along the lateral direction of the base 12, and is horizontal. The Z direction is perpendicular to both the X direction and Y direction.

The first moving device 14 is configured by, for example, a linear motor, and is provided with two guide rails 14a, and a slider 14b is movable along the guide rails 14a. The slider 14b of the linear motor-type first moving device 14 and be movably positioned in the Y direction along the guide rails 14a.

The slider 14b is provided with a motor 14c for Z-axis rotation (θZ). The motor 14c is, for example, a direct-type motor, and the rotor of the motor 14c is fixed to the substrate stage 22. In this way the rotor and the substrate stage 22 can index (rotational calculation) substrate stage 22 rotation along the Z direction by the current flow of the motor 14c. That is, the first moving device 14 moves the substrate stage 22 in the Y direction (first direction) and θZ direction.

The substrate stage 22 retains the substrate 1 at a predetermined position. The substrate stage 22 has a suction device not shown in the drawing, such that the substrate 1 is held on the top of the substrate stage 22 through a hole 22 in the substrate stage 22 by the operation of the suction device.

The second moving device 16 is configured by a linear motor, and is provided with a column 16b attached to the column 16a, guide rail 16c supporting the column 16b, and slider 16d for supporting along the guide rail 16b so as to be movable in the X direction. The slider 16d is movably positioned along the guide rail 16c in the X direction, and the droplet discharge head 3 is mounted to the slider 16d.

The droplet discharge head 3 has motors 18a, 18b, 18c, and 18d as oscillating position devices. The droplet discharge head 3 can be positioned vertically parallel to the Z axis by the operation of the motor 18a. The Z axis is a direction (vertical direction) perpendicular to both the X axis and Y axis. When the motor 18b operates, the droplet discharge head 3 is oscillated and positioned along the β direction around the Y axis. When the motor 18c operates, the droplet discharge head 3 is oscillated and positioned in the γ direction around the X axis. When the motor 18d operates, the droplet discharge head 3 is oscillated and positioned in the α direction around the Z axis. That is, the second moving device 16 supports the droplet discharge head 3 so as to be movable in the X direction (first direction) and z direction, and supports the droplet discharge head 3 so as to be movable in the θX direction and θZ direction.

Thus, the droplet discharge head 3 shown in FIG. 3 can be moved linearly and positioned in the Z-axis direction, and oscillated and positioned along the α, β, γ in the slider 16, and the droplet discharge face 3P can be accurately positioned or its posture controlled relative to the substrate 1 on the substrate stage 22 side. Moreover, a plurality of nozzles for discharging the droplets are provided on the droplet discharge face 3) of the droplet discharge head 3.

The electronic balance (not shown in the drawing) receives the a portion of 5000 droplets from the nozzles of the droplet discharge head 3, in order to manage the droplets by measuring the weight of one droplet discharged from the nozzles of the droplet discharge head 3. The electronic balance accurately measures the weight of one droplet by dividing the weight of the 5000 droplets by the number of droplets, that is, 5000 droplets. The weight of the droplets discharged from the droplet discharge head 3 can be optimally controlled based on the weight of the liquid droplets.

The cleaning unit 24 can clean the nozzles of the droplet discharge head 3 during the manufacturing process, periodically during wait time, or whenever necessary. The capping unit 25 caps the droplet discharge face 3P during wait time when not manufacturing devices so as prevent drying out of the droplet discharge face 3P of the droplet discharge head 3.

The droplet discharge head 3 can be selectively positioned at the top part of the electronic balance, cleaning unit 24, or capping unit 25 by moving the droplet discharge head 3 in the X direction using the second moving device 16. That is, even during the manufacturing process, the weight of the droplets can be measured by, for example, moving the droplet discharge head 3 to the electronic balance position. The droplet discharge head 3 can be cleaned by moving the droplet discharge head 3 onto the cleaning unit 25. Drying out can be prevented by moving the droplet discharge head 3 onto the capping unit 25 and attaching a cap to the droplet discharge face 3P of the droplet discharge head 3.

That is, the electronic balance, cleaning unit 24, and capping unit 25 are arranged at a distance form the substrate stage 22 directly below the movement path of the droplet discharge head 3 at the back end side of the base 12. Since the work related to supplying the substrate 1 on the substrate stage 22 and the work not related to supplying the substrate 1 are performed from the front end of the base 12, the work by the electronic balance, cleaning unit 24, and capping unit 25 is not impeded.

As shown in FIG. 3, as preparation discharge area (preparation discharge region) 27 is provided separate from the cleaning unit 24 for waste discharge or test discharge (preparatory discharge) of droplets from the droplet discharge head 3 at a part other than that supporting the substrate 1 on the substrate stage 22. The preparation discharge area 27 is provided along the X direction at the back end side of the substrate stage 22, as shown in FIG. 3. The preparation discharge area 27 is configured by a receiving member having a concave cross section open at the top and which is adhered to the substrate stage 22, and an absorbent material capable of absorbing the discharged droplets and which is disposed in the concavity of the receiving member and is replaceable.

The droplet discharge technique of the droplet discharge device is described below. Charge control methods, pressure oscillation methods, electromechanical conversion methods, electrothermal conversion methods, and electrostatic attraction methods are examples of discharge techniques employed in droplet discharge methods. The charge control method imparts a charge to a material using a charging electrode, controls the ejection direction of the material using a deflection electrode, and discharges the material from a nozzle. The pressure oscillation method applies an ultra high pressure of approximately 30 kg/cm2 to a material, and discharges the material to the leading end of a nozzle; when there is no control pressure the material is discharged directly from the discharge nozzle, whereas when there is control pressure, an electrostatic reaction occurs among the material, such that the material is not discharged from the discharge nozzle. The electromechanical conversion method uses the property of deforming piezoelectric element when a pulsed electric is received; the deformation of the piezoelectric element imparts a pressure through a flexible material to a space filled with a material, such that the material is pushed from the space and discharged from a discharge nozzle.

The electrothermal conversion method generates bubbles by rapidly vaporizing a material using a heater provided within a space filled with a material, such that the material within the space is discharged by the pressure of the bubbles. The electrostatic attraction method applies a small pressure within a space containing a material, and forms a meniscus of the material at the discharge nozzle, and in this state an electrostatic force is applied to pull the material from the nozzle. Other methods include methods using changes in viscosity of a flow in an electric field, and methods for ejection by discharge sparks. Among these methods, the piezo method is advantageous since it does not apply heat to the liquid material, and does not effect the composition of the material. In the present embodiment, the piezo method is used in view of the high degree of selectivity of liquid materials, and droplet controllability. The droplet discharge method has the advantage of not wasting material, and accurately placing material in a desired amount at a desired position. The weight of one droplet of the liquid material discharged by the droplet discharge method is, for example, 1 to 300 nano grams.

Figure 4:
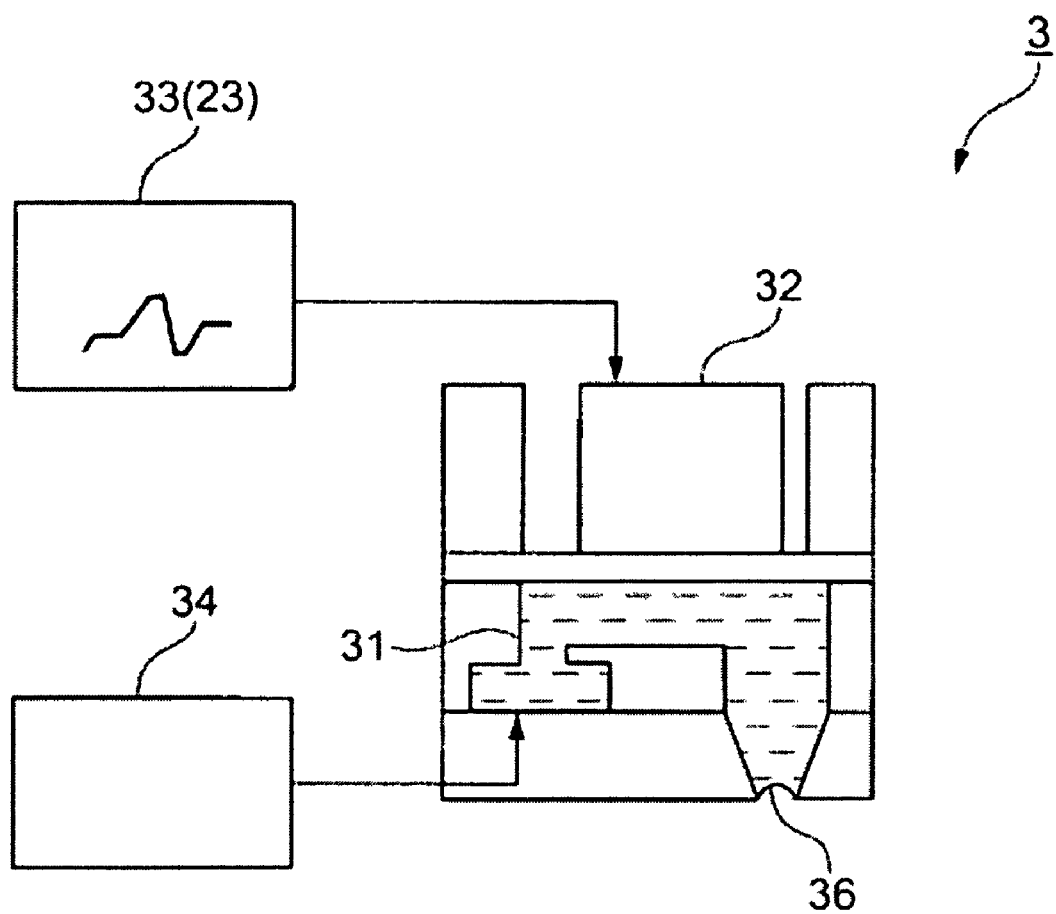
FIG. 4 is a schematic view of a droplet discharge head used to illustrate the principle of droplet discharge by the piezo method.

FIG. 4 is a schematic view of a droplet discharge head used to illustrate the principle of droplet discharge by the piezo method. In FIG. 4, a piezo element 32 is disposed adjacent to a fluid chamber 31 (pressure chamber) accommodating a liquid material. A fluid supply system 34 is connected to the fluid chamber 31, such that liquid material is supplied into the fluid chamber 31 through the fluid supply system 34. The piezo element 32 is connected to a drive circuit 33, and expands in response to a voltage applied through the drive circuit 33. When the piezo element 32 expands, the fluid chamber 31 is deformed and pressure is applied on the liquid material contained in the chamber, and the liquid material is discharged as droplets from a nozzle 36.

A plurality of nozzles 36 are arranged in a row on the droplet discharge head 3, and a control device 23 controls the voltage applied to the piezo element, that is, controls the discharge of the liquid material from the plurality of nozzles 36 by controlling the drive signals. Specifically, the control device 23 changes the volume of the droplets discharged fro the nozzle 36, the number of the droplets discharged per unit time, the distance of droplets and the like. For example, the distance of a plurality of droplets can be changed by selectively using the nozzles to discharge the droplets among the plurality of nozzles in the array.

Figure 5:
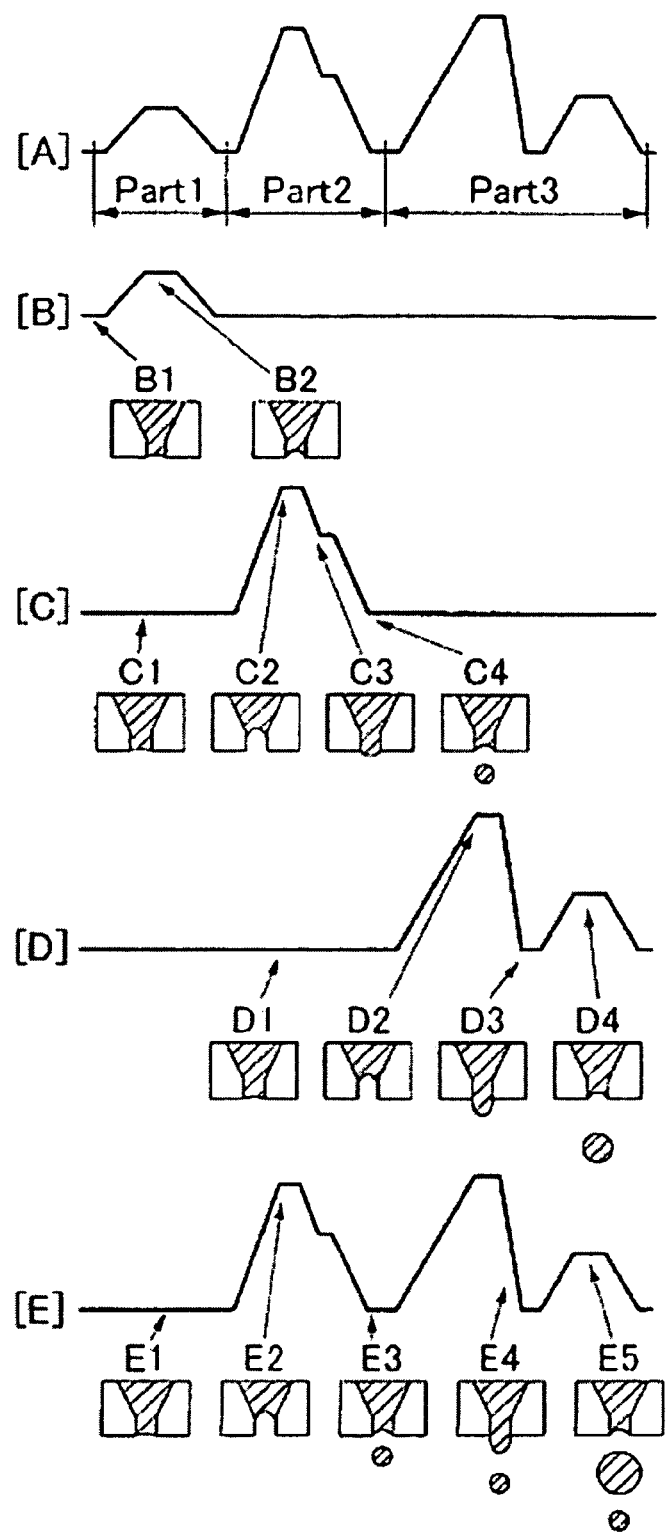
FIG. 5 is a schematic view showing examples of drive signals applied to the piezo element, and the state of the liquid material within the nozzle corresponding to the electric signal.

FIG. 5 is a schematic view showing examples of drive signals applied to the piezo element, and the state of the liquid material within the nozzle corresponding to the electric signal. The principle of discharging three types of droplets, that is, small dot, medium dot, and large dot droplets each having a different volume is described below based on FIG. 5. In FIG. 5, a drive waveform [A] is a basic waveform generated by a drive signal generator. Waveform [B] is formed by part 1 of the basic waveform, and is used to oscillate a meniscus (concave-convex surface of the liquid) to diffuse the thicker fluid near the nozzle opening, and prevent poor discharge of small droplets before it happens. B1 shows the state of a static meniscus; B2 shows the operation of drawing some of the meniscus into the nozzle by expanding the volume of the fluid chamber (pressure chamber) by slightly recharging the piezo element.

The waveform, [C] is formed by part 2 of the basic waveform, and is a waveform for discharging small dot droplets. First, the piezo element is rapidly recharged from the static state (C1), and the meniscus is quickly drawn into the nozzle (C2). Then, a small dot droplet is applied by slightly contracting (C3) the fluid chamber with a timing that starts an oscillation of the once drawn meniscus in a direction to fill the nozzle. After a rest during recharging, a second recharge (C4) functions to control the ejection state of the droplet and dampens the oscillation of the residual signal of the piezo element and the meniscus after the discharge operation.

The waveform [D] is formed by part 3 of the basic waveform, and is a waveform for discharging a medium dot droplet. A medium dot droplet is discharged by rapidly contracting (D3) the fluid chamber with a timing that draws more meniscus from a static state (D1) and starts an oscillation of the meniscus in a direction to again fill the nozzle. In D4, the meniscus and piezo element residual oscillation are dampened by recharging/discharging the piezo element. Waveform [E] is formed by combining part 2 and part 3 of the basic waveform, and is a waveform for discharging a large dot droplet. First, a small dot droplet is discharged in processes E1, E2, and E3, and a waveform is applied to the piezo element to discharge a medium dot droplet with a timing to oscillate the residual meniscus slightly so as to fill the nozzle with liquid after the small dot droplet has been discharged. The droplets discharged in processes E4 and E5 have a volume greater than the medium dot, so as to form a large dot droplet by combining with the previous small dot droplet. Three different types of droplets, that is, small dot, medium dot, and large dot, having different volumes can be discharged by controlling the drive signals in this manner.

The plasma process device used in the $CF_4$ plasma process of the liquid repellency process method, and the plasma process device used in the $O_2$ plasma process of the lyophilic process method are described below. The $CF_4$ plasma process and the $O_2$ plasma process can basically be executed using the same plasma process device.

Figure 6:
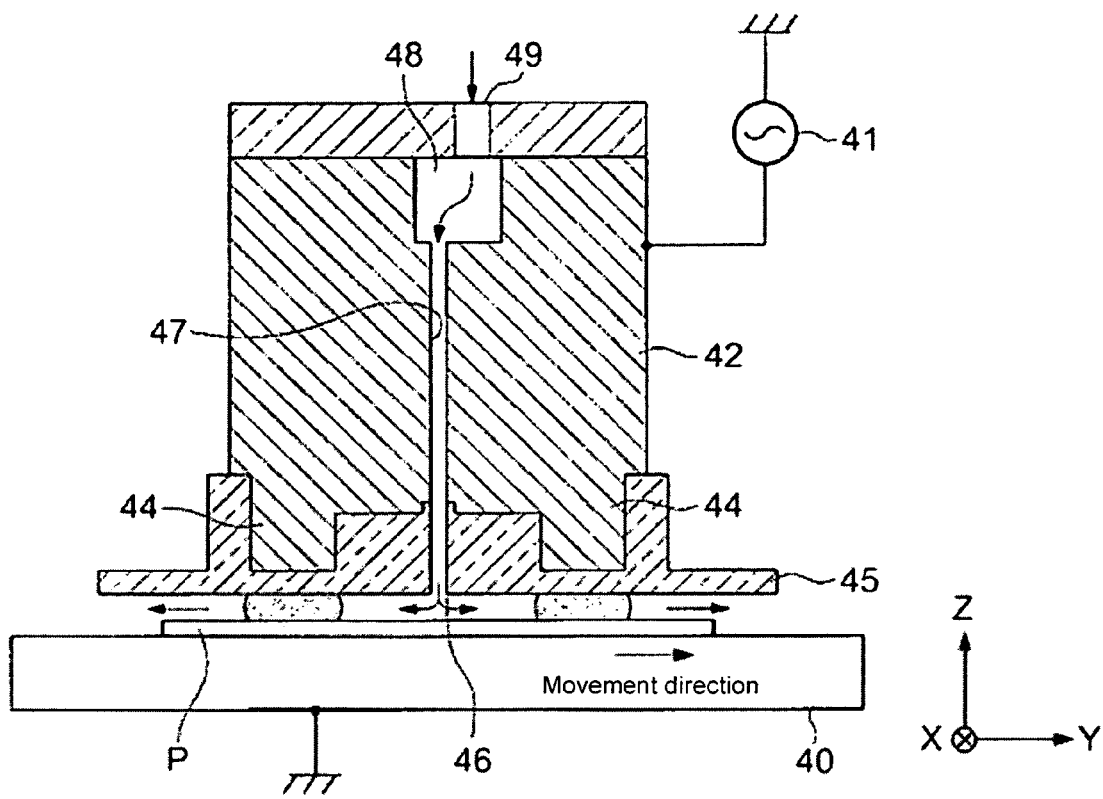
FIG. 6 is a brief structural diagram of the plasma process device.

FIG. 6 is a brief structural view showing an example of a plasma process device used when performing the $CF_4$ plasma process or the $O_2$ plasma process. The plasma process device shown in FIG. 6 has an electrode 42 connected to an alternating current power source 41, and a sample table 40 as a ground electrode. The sample table 40 supports the sample substrate P, and is movable in the Y-axis direction. Two parallel discharge generators 44 and 44, which extending in the X-axis direction and perpendicular to the movement direction, project from the bottom surface of the electrode 42, and a conductive member 45 is provided so as to circumscribe the discharge generators 44. The conductive member 45 prevents abnormal discharge of the discharge generators 44. The bottom surface of the electrode 42 including the conductive member 45 is essentially planar in shape, and a space (discharge gap) is formed between the discharge generators 44 and conductive member 45, and the substrate P. A gas port 46 configuring part of the gas supply part formed in the X-axis direction is provided at the center of the electrode 42. The gas port 46 is connected to a gas inlet 49 through a gas flow path 47 and intermediate chamber 48 within the electrode.

A predetermined gas, which includes the processing gas injected from the gas port 46 through the gas path 47, is divided and flows forward and backward in the movement direction (Y-axis direction) within the space. Simultaneously, a predetermined voltage supplied from the Alternating current power source 41 to the electrode 42, and a gas discharge is generated between the discharge generators 44 and the sample table 40. A predetermined excitation of the gas is generated by the plasma produced by the gas discharge, and the entire surface of the substrate P is continuously processed as it passing through the discharge region.

When $O_2$ plasma processing is executed, the predetermined gas is a mixture of oxygen ($O_2$) as a processing gas, dilution gases such as helium (He) and argon (Ar) easily start and support stability of the discharge under pressure near atmospheric pressure, and an inert gas such as nitrogen ($N_2$).

The first embodiment provides the following effects.

(1) When forming the resist film 9 in region 2, a band-like margin band film 7a is first formed in the margin part of the region 2, then the interior of the margin band film 7a is filled with liquid material to form a resist film 9. When the liquid material fills the interior part of the margin band film 7a, the liquid material is prevented from flowing outside region 2 by the wall-like margin band film 7a, such that the region is sufficiently filled by the liquid material.

(2) When forming the resist film 9 in region 2, a band-like margin band film 7a is first formed in the margin part of the region 2, then the interior of the margin band film 7a is filled with liquid material to form a resist film 9. Since the margin band film 7a does not move even when receiving a force from the liquid material filling the interior, there is scant wetting outside of the region 2 compared to methods that continuously arrange the liquid material over the entirety of the region 2.

(3) When time is required for natural drying or natural hardening of the margin band 6a, a process of drying the margin band 6a or a process of promoting the hardening of the margin band 6a is performed. The margin band film 7a formed by the dried or hardened margin band 6a is a rigid wall circumscribing the region 2, and reliably prevents liquid material filling the region 2 from flowing out from the region 2.

(4) When forming the margin band 6a, the surface of the substrate 1 can be adjusted to a contact angle of, for example, 80 degrees relative to water, then the margin band film 7a is formed at a height that allows filling of the liquid material to a sufficient thickness by executing the liquid repellency process.

(5) Before executing the liquid repellency process, the lyophilic process is performed on the surface of the substrate 1 to form a lyophilic film 10 on the surface that includes the region 2, and the contact angle relative to water, for example, is a set value within a range from 0 to 10 degrees, for example, 10 degrees. Since the contact angle relative to the liquid material on the surface of the substrate 1 is the essentially same when starting the liquid repellency process, this prevents shifting of the contact angle on the substrate 1 after the liquid repellency process. At the same time, this also prevents shifting of the contact angle relative top the liquid material after liquid repellency processing between substrates 1.

(6) Droplets 4 are discharged within the region circumscribed by the margin band film 7a, and a lyophilic process is executed with the contact angle relative to water less than 30 degrees before filling the region circumscribed by the margin band film 7a with liquid material there is excellent wetting since the droplet 4 is applied to the surface at a contact angle relative to water of less than 30 degrees, and the liquid material fills the region circumscribed by the margin band film 7a without gaps. Furthermore, the droplets 4 become flattened to provide excellent wetting, such that the surface of the center film 8a is flatter than when the droplets 4 have a granular shape that does not wet the liquid-repelling surface.

(7) The granular droplets 6 for forming the margin band film 7a are arranged in a row at a intervals that produce a partial and mutual overlapping of droplets 6 in the margin part of the region 2. A wall-like and gapless margin band film 7a is formed by arranging the granular droplets 6 at intervals so as to mutually and partially overlap. Since the distance is reduced between the mutually and partially overlapping granular droplets 6, the cycle of irregularities on the perimeter is reduced, and a perimeter shape with few irregularities can be formed. Since the surface area required for the margin band film 7a can be made small by arranging the granular droplets 6 in a single row, the margin band film 7a can be formed even when the region 2 is a narrow region. Furthermore, the time required for forming the margin band can be reduced.

(8) The droplet discharge head 3 of the droplet discharge device IJ can independently control the discharge for a plurality of nozzles. Therefore, the droplets 4 can be shot at an optional position on the substrate 1. Accordingly, the droplets 4 is applied at the exact margin part of the region 2, and a margin band film 7a is formed so as to for a region 2 having a precise shape.

(9) Since the droplet discharge head 3 can easily change the volume of the discharged droplet, a droplet 4 of optimum volume for forming the margin band film 7a can be discharged, to form an effective film pattern.

A second embodiment of the film pattern forming method of the present invention is described below. In the present embodiment, a method is described for forming a SAW resonating piece resist film configuring a SAW (surface acoustic wave) resonating piece as an example of a surface elastic wave oscillation device. The droplet discharge method, droplet discharge device, liquid repellency process and lyophilic process of the present embodiment are basically identical to the droplet discharge method, droplet discharge device, liquid repellency process and lyophilic process of the first embodiment.

Figure 7:
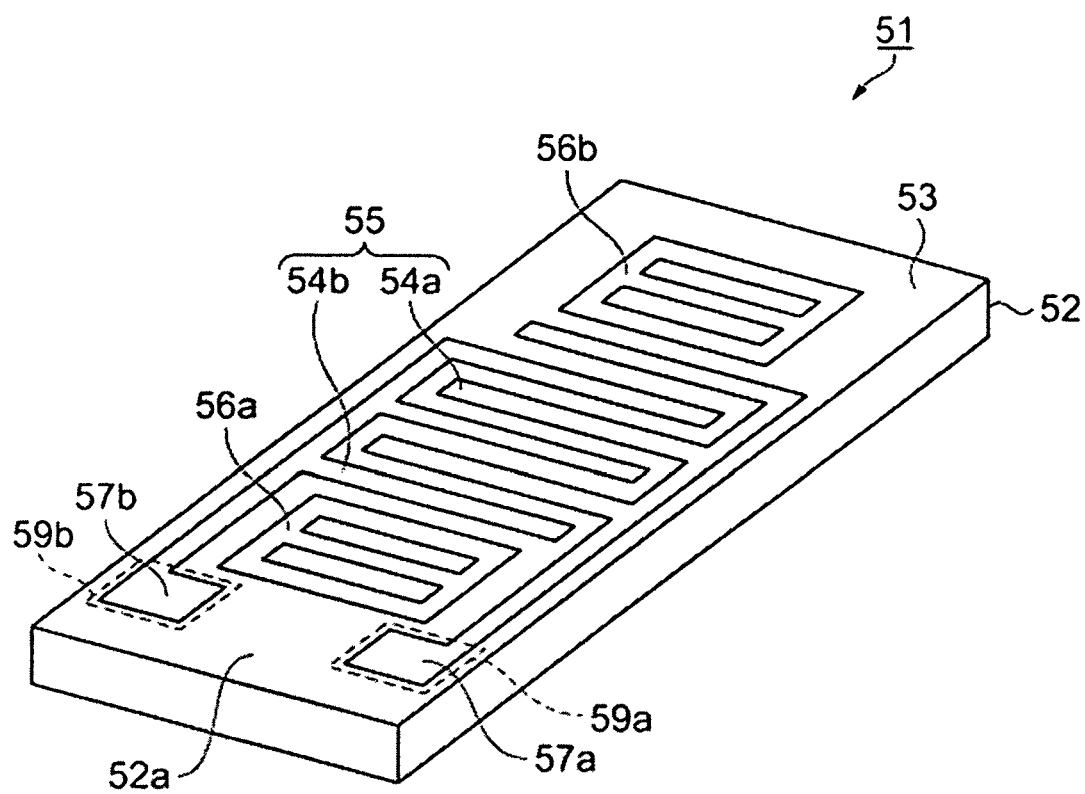
FIG. 7 is a perspective view of a SAW resonating piece.

First, the SAW resonator 60 (refer to FIG. 8) is described. The SAW resonator 60 is formed by sealing a SAW resonating piece 51 in a housing (refer to FIG. 8). FIG. 7 is a perspective view showing an example of a SAW resonating piece. The SAW resonating piece 51 shown in FIG. 7 has a piezoelectric member, such as liquid crystal, lithium tantalate, lithium niobate or the like cut square as a base (chip). A piezoelectric member chip 52 of the present embodiment is cut in a flat rectangular shape, and has an inter digital transducer (IDT) electrode 55 configured by pair of electrodes 54a and 54b in the center of a surface (main surface) 53. Lattice-like reflectors 56a and 56b are formed on bilateral sides of the IDT 55 in the length direction. The pair of electrodes 54a and 54b forming the IDT 55 are directed to the end 52a of the chip 52 through the exterior side of one reflector 56a, that is through the insulation side of the chip, and form connector lands 57a and 57b that have somewhat wider surface areas.

The electrodes 54a and 54b, reflectors 56a and 56b, and connection lands 57a and 57b are normally a conductive material, for example, gold, aluminum, aluminum steel alloy or the like, and aluminum is often used from the perspectives of processing and cost. The regions 59a and 59b indicated by the dashed lines in FIG. 7 are regions for forming anodic oxidation resist films described later, and are equivalent to the predetermined region and margin area described in the first embodiment. The SAW resonating piece 51 is equivalent to a surface elastic wave device.

Since the SAW resonator 60 obtains a resonance frequency by an elastic surface wave of the main surface 53 of the SAW resonating piece 51, the SAW resonating piece 51 is fixed to the housing of the SAW resonator 60 to ascertain the effect on the resonance frequency. Affects on the resonance frequency vary depending on the method of fixation; fixing one end of the SAW resonating piece 51, the so-called piece mounting, is used as a method of mounting the SAW resonating piece 51 with minimal change to the resonance frequency.

Figure 8:
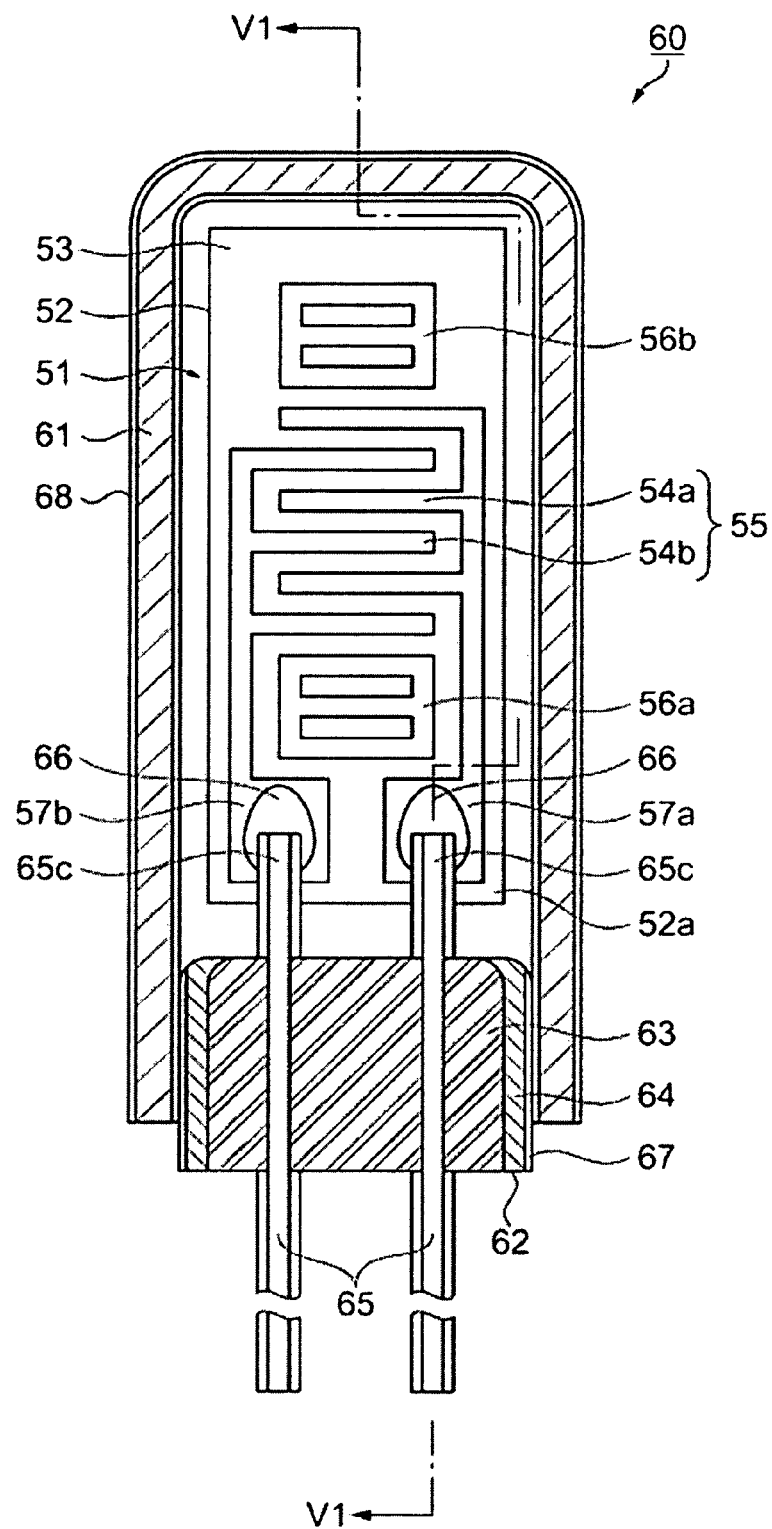
FIG. 8 is a cross section view briefly showing the structure of a SAW resonator.
Figure 9:
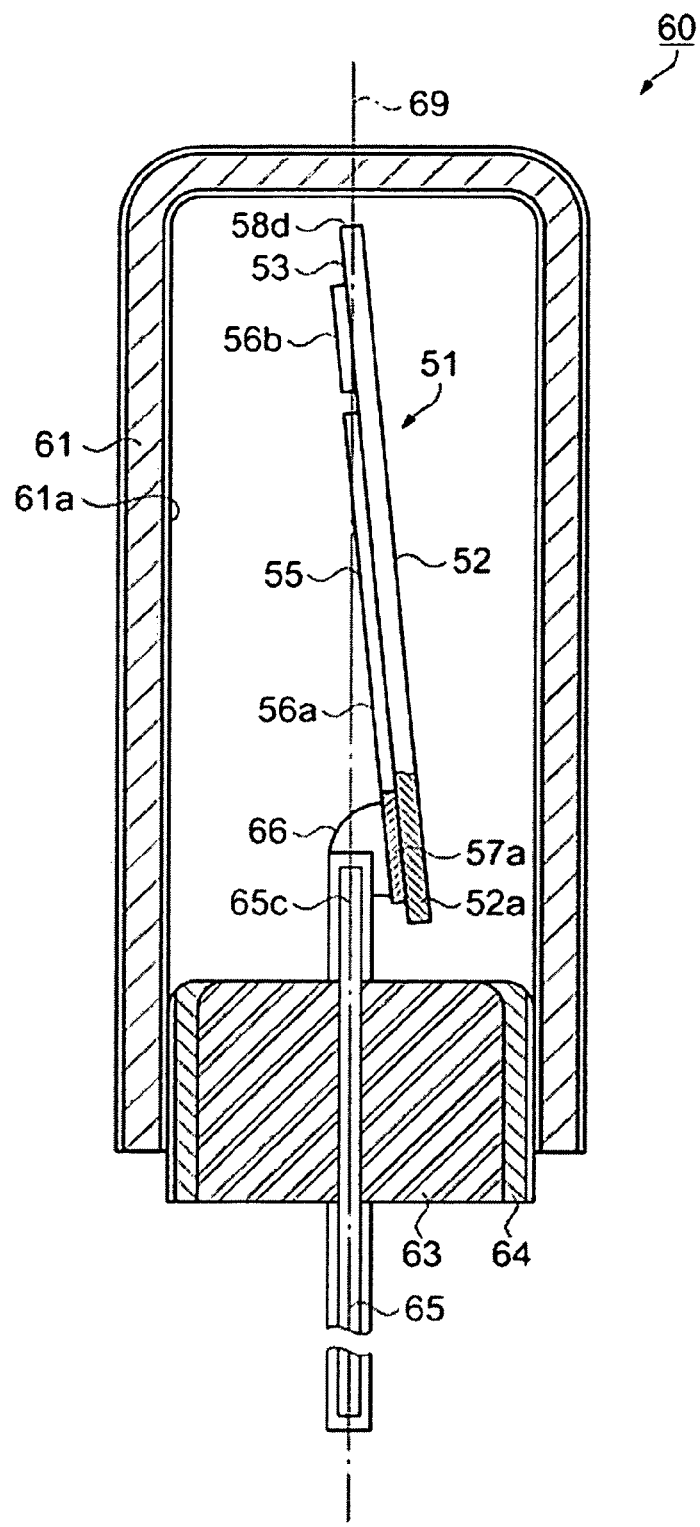
FIG. 9 is a cross section view briefly showing the structure of a SAW resonator.

FIGS. 8 and 9 are cross section views briefly showing the SAW resonator with the SAW resonating piece mounted using a lead. FIG. 9 is a cross section view of the V1-V1 cross section. In the SAW resonator 60, the SAW resonating piece 51 is housed within a box-like metal case 61 open at one end; a so-called hermetic terminal 62 is inserted into the opening of the metal case 61, thus sealing the case 61. The hermetic terminal 62 is provided with a metal ring 64 on the perimeter of a glass part 63, and the glass part 63 has two leads 65 passing therethrough. The lead ends 65c and 65c of the leads 65 within the case 61 are respectively connected to connecting lands 57a and 57b of the SAW resonating piece 51, such that the SAW resonating piece 51 is mounted within the case 61 by the hermetic terminal 62 hereinafter referred to a "lands" which includes the lead 65) through the leads 65.

The lead terminals 65c are adhered by an adhesive 66 to the connecting lands 57a and 57b, and this adhesive 66 is solder or conductive adhesive for obtaining electrical conduction. It is important that the lead terminals 65c and connecting lands 57a and 57b have a low resistance connection. Plug plating 67 and case plating 68 are performed on the metal ring 64 of the plug body and the case 61 so as to maintain the airtightness within the case, the these platings function as seals.

As shown in FIG. 9, the SAW resonating piece 51 is connected to the leads 65 such that the main surface 53 is inclined relative to the center axis 69 of the case 61 as indicated by the dashed line, and such that the center axis 69 and SAW resonating piece 51 intersect. Since the SAW resonating piece 51 is mounted at the center of the case 61 when the SAW resonating piece 51 is mounted and even though the leads 65 are provided in the center of the plug body, adequate gap between the SAW resonating piece 51 and inner surface 61a of the case 61 can be ascertained. When the SAW resonating piece 51 is assembled within the case 61 there is no contact between the SAW resonating piece 51 and the case 61 due to the provision of the gap therebetween, and the possibility of unstable oscillation of the SAW resonating piece 51 by contact of the case 61 and SAW resonating piece 51 is eliminated. Furthermore, problems generated by debris producing contact of the SAW resonating piece 51 and the case 61 can be prevented.

The angle of inclination of the SAW resonating piece 51 is preferably within a range from the position at which the SAW resonating piece 51 and center axis 69 are parallel to the intersection of the center axis 69 and the endface 58d on the side of the chip 52 that is not provided with the connecting land. The leads 65c are connected to the connecting lands 57a and 57b by adhesive 66, and can be easily set at a mounting angle since there is no direct contact with the connecting lands 57a and 57b. In order to incline the SAW resonating piece 51 relative to the center axis 69, the SAW resonating piece 51 and lead terminal 65c may be adhered in parallel, then the lead 65 inclined relative to the center axis 69, or the lead 65c may be cut or scraped at a predetermined angle and connected to the connecting lands 57a and 57b using the cut surface or scraped surface.

Therefore, the SAW resonating piece 51 is mounted so as to be supported floating from the housing of the case 61, providing an empty space around the SAW resonating piece 51, and making it difficult for the SAW resonating piece 51 to be affected by the surrounding environment. Moreover, the empty space formed around the SAW resonating piece 51 is a space that could possibly be contaminated by SUS flakes or solder drops or other foreign matter when the SAW resonating piece 51 is sealed. There is a possibility that such foreign matter might corrode the electrodes of the SAW resonating piece 51, for example, the electrodes connected to the IDT 55, or connecting the IDT 55 and connecting lands 57a and 57b. In particular, since the IDT 55 is arranged with a micron order precision, conductive foreign matter may produce shorting of the electrodes, and impair the stable operation of the SAW resonator 60. However, since most foreign matter is on a micron order, it is difficult to completely prevent contamination. Furthermore, since the SAW resonator is put to various uses, and foreign matter may move due to impact during packaging and shipping, or when packaged at an angle, it is difficult to completely prevent problems when assembling and packaging the SAW resonator 60.

In order to prevent problems with foreign matter, it is possible, for example to coat the IDT 55 with a silicon oxide or the like. However, forming a coating layer on the chip changes the resonance frequency and lowers the Q value, and may impair the effectiveness of the piece mounting. An oxide film naturally formed on the surface of the aluminum electrodes reduces conductivity and may function as an insulation layer, thus preventing shorts. However, a naturally formed thin oxide film is insufficiently strong when formed at 10~30 Angstroms; it is difficult to completely protect the electrodes from foreign matter that moves due to impacts caused by dropping or the like. In this respect, an oxide film of approximately 280 Angstroms or thicker is formed on the surface by anodic oxidation of the aluminum electrodes of the SAW resonating piece 51, so as to prevent problems with foreign matter.

Figure 10:
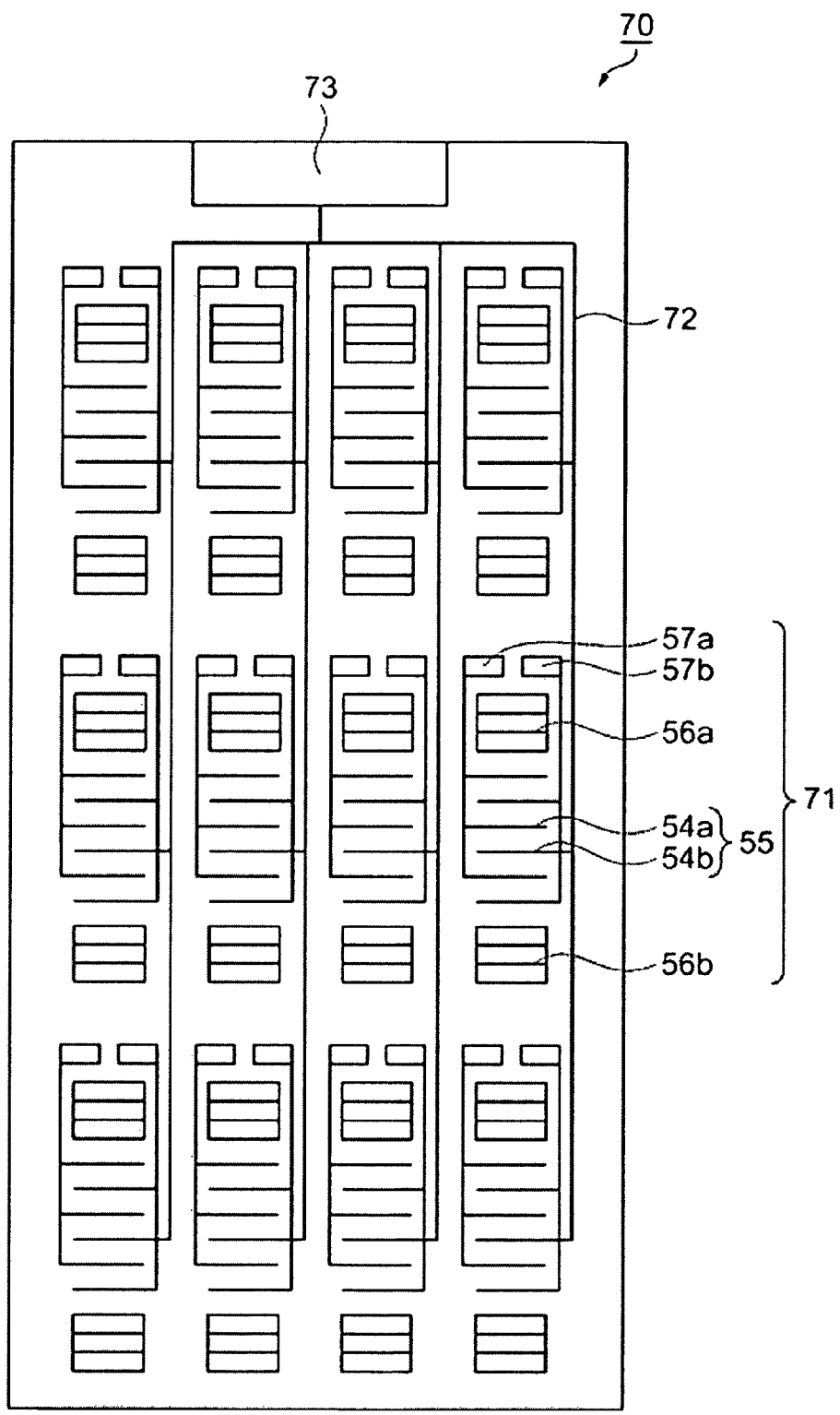
FIG. 10 is a plan view of a wafer on which are formed a plurality of SAW patterns.

FIG. 10 is a plan view of a wafer with a plurality of SAW patterns. A plurality of SAW patterns on a piezoelectric wafer 70 are treated by anodic oxidation as shown in FIG. 10. In this example, only one electrode among a pair of electrodes 54*a* and 54*b* configuring the IDT 55 is treated by anodic oxidation. Therefore, in addition to a SAW pattern 71, the wafer 70 is provided with a connection lead 72 connected to the electrode 54*b* of the SAW pattern 71, and a terminal 73 connected to an anodic oxidation power source.

Figure 11:
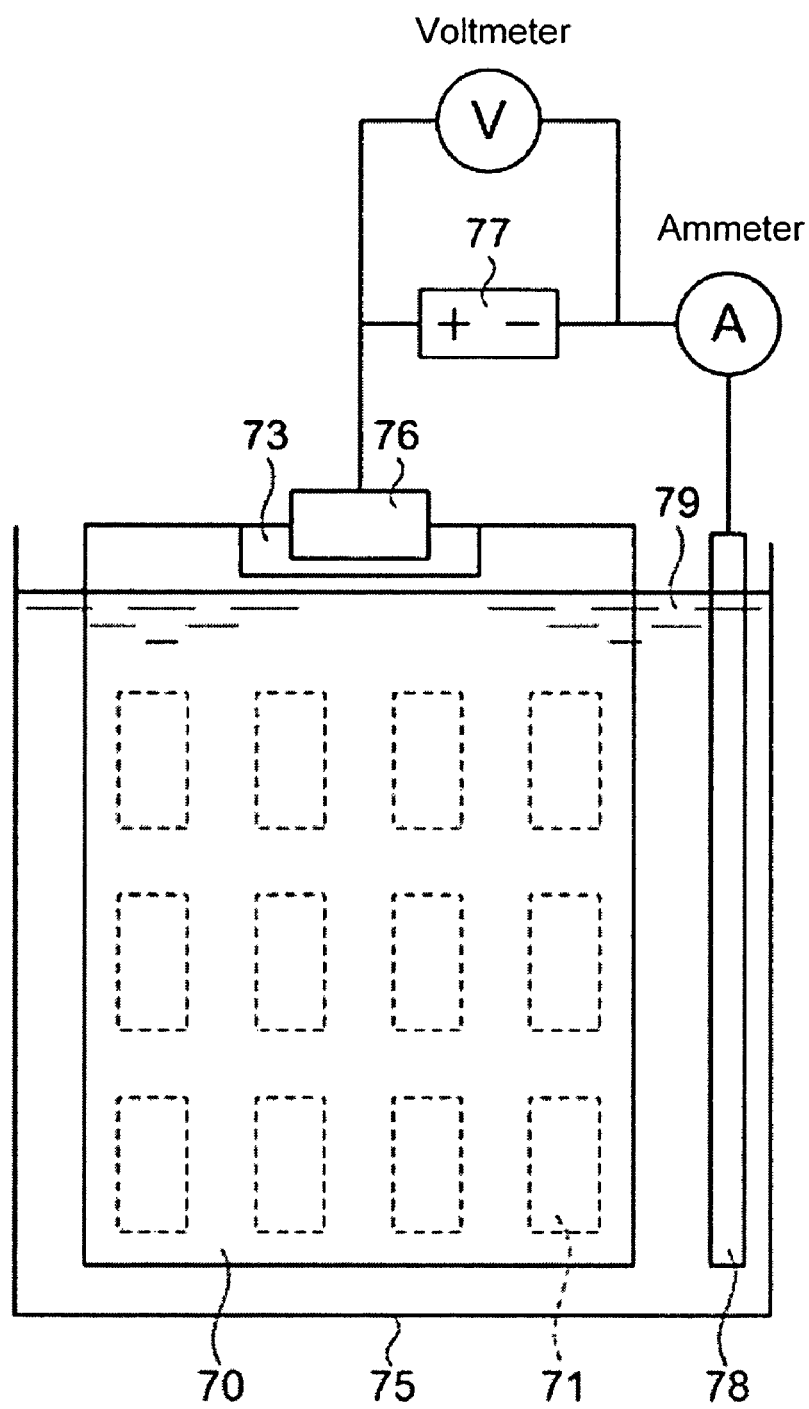
FIG. 11 is a schematic view showing the essential parts of the device for performing anodic oxidation.

FIG. 11 is a schematic view briefly showing the device for anodic oxidation. An anodic oxidation fluid 79 is added to a tank 75, and the terminal 73 is held by a clip 76 as the wafer 70 is immersed in the anodic oxidation fluid 79. A current flows from the power source 77 to the anode on the wafer 70. A cathode 78 immersed in the anodic oxidation fluid 79 is also connected to the power source 77. For example, a nonporous oxide film is formed by anodic oxidation. Therefore, a mixture of phosphate aqueous solution and borate aqueous solution is used as the anodic oxidation fluid 79. Alternatively, a near neutral basic aqueous solution, such as citrate, adipate and the like, may be used. The fluid temperature is preferably room temperature to avoid forming a porous film, for example, a temperature of 20~30° C. is desirable when a borate aqueous solution is used.

An oxide film having a thickness approximately proportional to the applied voltage can be formed on the surface of the electrode by anodic oxidation performed under the following conditions. In order to control the thickness of the oxidation layer and control a constant current flow while current is input, it is desirable that a constant voltage/constant current power source is used as the process power source. It is important that, at the part of the electrode corresponding to the connecting land 57*b*, there is a low resistance connection between the lead ends 65*c* and the connecting lands 57*a* and 57*b*, and it is desirable that the oxide film is not formed on the connecting lands 57*a* and 57*b*. Therefore, a resist film is formed on the part corresponding to the connecting land 57*b* to prevent additional thickness of the oxide film.

Figure 12:
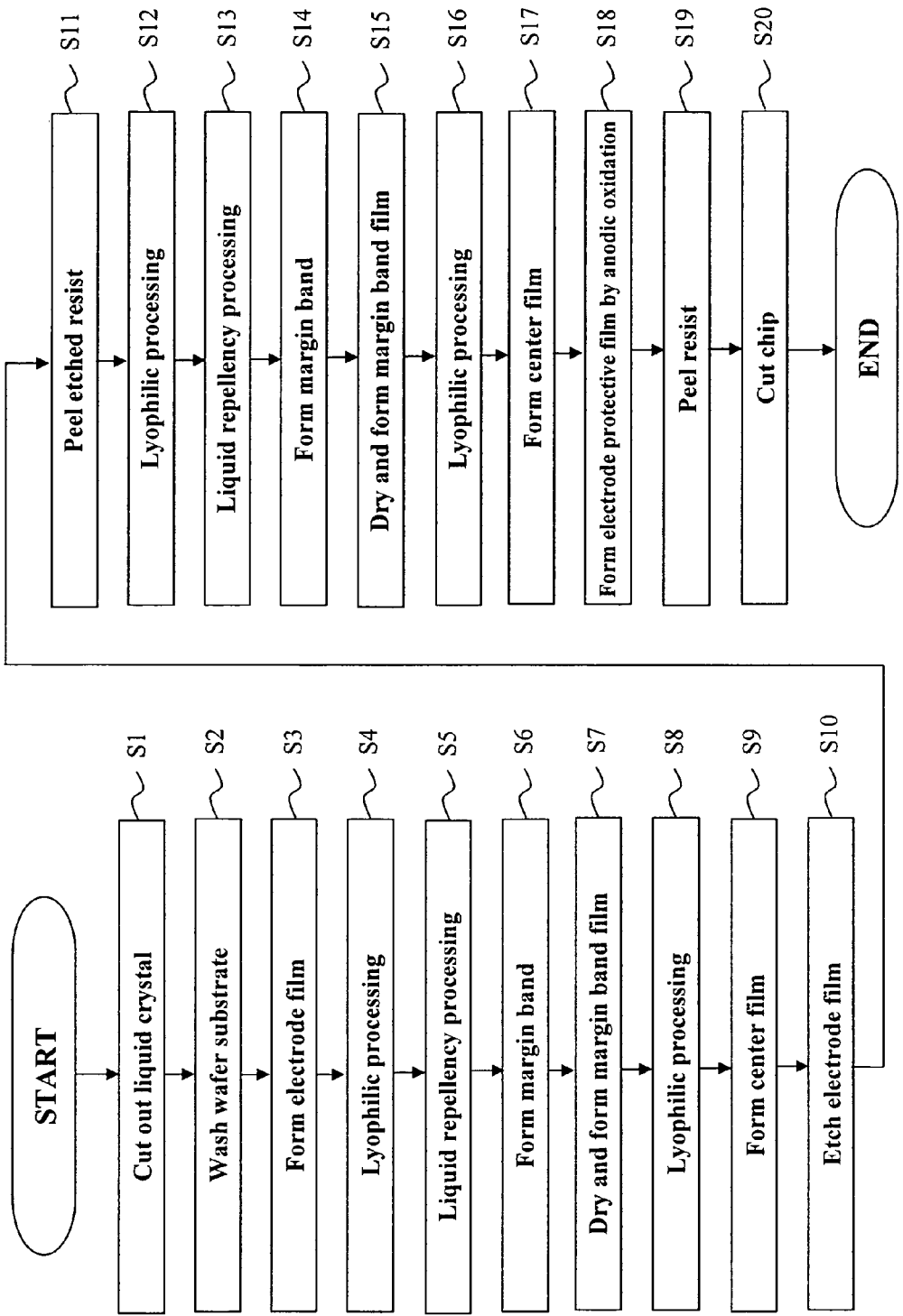
FIG. 12 is a flow chart showing an example of the manufacturing process of the SAW resonating piece.

The manufacturing process of the SAW resonating piece 51 of the present embodiment is described below. FIG. 12 is a flow chart showing an example of the manufacturing process of the SAW resonating piece 51. In step S1, a plate-like wafer substrate from a liquid crystal block as the substrate of the wafer 70 (refer to FIG. 10). In step S2, the cut wafer substrate is washed. In step S3, a thin electrode film of aluminum material is formed on the main surface of the wafer substrate by, for example, vapor deposition.

In step S4, a lyophilic process is performed with the contact angle of the electrode film surface relative to water set at a fixed value in a range from 0 to 10 degrees, for example, 10 degrees. In step S5, the surface of the electrode film treated at a contact angle of 10 degrees relative to water is subjected to liquid repellency processing, and the contact angle of the electrode film surface relative to water is set at 60 degrees or higher, for example 80 degrees.

In step S6, a liquid etching resist material is discharged onto the electrode film. The discharge method is the method described in the first embodiment. Droplets of the etching resist material are discharged from the droplet discharge head 3 (refer to FIG. 3), and applied in the margin part having the shape of IDT 55, reflectors 56*a* and 56*b*, connecting lands 57*a* and 57*b* (refer to FIG. 7) and the like, to form a margin band of the etching resist material. In step S7, a drying process is performed to form the margin band film when a slow drying etching resist material is used and the margin band has not dried sufficiently to perform the next step as described in the first embodiment. The drying process need not be performed when a fast drying etching resist material is used.

In step S8, the electrode film surface with the formed margin band film is subjected to a lyophilic process, and the contact angle of the electrode surface relative to water is adjusted to less than 30 degrees, for example, 10 degrees.

In step S9, droplets of the etching resist material are discharged in the region circumscribed by the margin band film, so as to fill the region with the etching resist material and form a center film. The etching resist material is dried or hardened to form etching resist films having the shape of the IDT 55, reflectors 56*a* and 56*b*, and connecting lands 57*a* and 57*b*, thus becoming the margin band film and center film. A drying process is performed to form the center film when a slow drying etching resist material is used and the center film has not dried sufficiently to perform the next step as described in the first embodiment.

In step S10, the electrode film is etched to form the IDT 55, reflectors 56*a* and 56*b*, and connecting lands 57*a* and 57*b*. In step S11, the etching resist film is peeled off from the IDT 55, reflectors 56*a* and 56*b*, and connecting lands 57*a* and 57*b*.

In step S12, the wafer substrate is subjected to a lyophilic process similar to step S4, and the contact angle of the surface on which the IDT 55, reflectors 56*a* and 56*b*, and connecting lands 57*a* and 57*b* are formed relative to water is set at a fixed value in a range from 0 to 10 degrees, for example, 10 degrees. In step S13, the wafer substrate surface having been set at, for example, a contact angle of 10 degrees relative to water is subjected to a liquid repellency process, and the contact angle of the wafer substrate surface relative to water is set at 60 degrees or higher, for example, 80 degrees.

In step S14, a liquid anodic oxidation resist material is discharged on the regions 59*a* and 59*b* so as to cover the connecting lands 57*a* and 57*b* (refer to FIG. 7). The discharge method is the method described in the first embodiment. The droplets of anodic oxidation resist material is discharged from the droplet discharge head 3 (refer to FIG. 3), and is first applied to the margin part of the regions 59*a* and 59*b*, and forms a margin band of anodic oxidation resist material.

In step S15, a drying process is performed to form the margin band film when a slow drying anodic oxidation resist material is used and the margin band has not dried sufficiently to perform the next step as described in the first embodiment. The drying process need not be performed when a fast drying anodic oxidation resist material is used.

In step S16, the wafer substrate surface having the formed margin band film is subjected to a lyophilic process, and the contact angle is the wafer substrate surface relative to water is adjusted to less than 30 degrees, for example, 10 degrees.

In step S17, droplets of anodic oxidation resist material are discharged into the region circumscribed by the margin band film, so as to fill the region with anodic oxidation resist material and form a center film. The anodic oxidation resist material is dried or hardened to form an anodic oxidation resist film covering the connecting lands 57*a* and 57*b* and consisting of the margin band film and center film. A drying process is performed to form the center film when a slow drying anodic oxidation resist material is used and the center film has not dried sufficiently to perform the next step as described in the first embodiment. The drying process need not be performed when a fast drying anodic oxidation resist material is used.

Phenol resins are generally used as anodic oxidation resist material, and novolac is particularly desirable. The material may be polymerized and hardened by exposure to light after being applied in a monomer state, or may be polymerized beforehand and applied dissolved in a solvent in a polymer state. In the case of a polymer having anodic oxidation resistance properties, the structure is not particularly limited, and so-called resins may be used. Specific examples of useful polymers include polyepoxy, polyethylene, polyester, polyacrylate, polymethacrylate, polyvinyl, polystyrene, polyurethane, polysiloxane, polyimide, polyamide, and polycarbonate. If these monomers may be used as liquid material insofar as an initiator or the monomer itself causes a polymerization reaction when stimulated by heat or light so as to form a polymer.

Similarly, solvents are not specifically limited insofar as the polymer or monomer is dissolvable in the solvent. Specific examples include polar compounds such as propylene carbonate, γ-butylolactone, N-methyl-2-pyrolidone, N,N-dimethylacetoamide, dimethylformamide, dimethylsulfoxide, 4-methyl-2-pentanone (MIBK), cyclohexanone, ethylactate, 1-methoxy-2-acetoxypropane (PEGMEA), 2-methoxyethoxyethanol, methylethylketone, methylisobutylketone, ethyl acetate, butyl acetate, cellosolve acetate and the like; hydrocarbon compounds such as n-heptane, n-octane, decane, dodecane, tetra decane, hexadecane, toluene, xylene, cymene, durene, indene, dipentene, tetrahydronaphthalene, decahydronaphthalene, cyclohexane, cyclohexylbenzene and the like, ether compounds such as ethylenglycol dimethyl ether, ethyleneglycol diethyl ether, ethyleneglycol methylethyl ether, diethyleneglycol dimethyl ether, diethyleneglycol diethyl ether, diethyleneglycolmethylethyl ether, 1,2-dimethoxyethane, bis(2-methoxyethyl)ether, p-dioxane, butyl cellosolve and the like, and alcohol compounds such as methanol, ethanol, propanol, butanol, hexanol, octanol, cyclohexanol, α-terpenol and the like. Industrial thinners may be used with many polymers.

In step S18, anodic oxidation is performed to form an oxide film as an electrode protective film on the surface of the IDT 55. The anodic oxidation method used the method described in the first embodiment based on FIGS. 10 and 11.

In step S19, the anodic oxidation resist film covering the connecting lands 57a and 57b is peeled off. In step S20, the wafer 70 is cut in a chip shape, and the SAW resonating piece 51 is formed. Step S20 is executed, and the SAW resonating piece 51 manufacturing process ends.

The second embodiment provides the following effects.

(1) Droplets of applied liquid etching resist material are prevented from flowing from the electrode forming region and wetting outside the electrode forming region by forming an etching resist film in a predetermined electrode shape and thickness. Accordingly, electrodes such as the IDT 55, reflectors 56a and 56b, and connecting lands 57a and 57b can be formed in precise shapes.

(2) Applied liquid anodic oxidation resist film material is prevented from flowing outside the connecting lands 57a and 57b forming regions and wetting outside the regions by forming an anodic oxidation resist film of sufficient thickness and accurately covering the connecting lands 57a and 57b. Accordingly, the anodic oxidation resist film covering the connecting lands 57a and 57b can be formed at the connecting lands 57a and 57b without covering the IDT 55 that requires the anodic oxidation process.

(3) Applied liquid anodic oxidation resist film material is prevented from flowing outside the connecting lands 57a and 57b forming regions and wetting outside the regions by forming an anodic oxidation resist film of sufficient thickness and accurately covering the connecting lands 57a and 57b. Accordingly, banks regulating the shape of the anodic oxidation resist film are unnecessary, and the anodic oxidation resist film can be formed at the connecting lands 57a and 57b without covering the IDT 55 that requires the anodic oxidation process.

(4) A liquid repellency process is performed before the droplets of the etching resist material are discharged to margin parts in the shapes of the IDT 55, reflectors 56a and 56b, and connecting lands 57a and 57b, such that the surface of the electrode film can be adjusted to a contact angle relative to water of, for example, 80 degrees when forming the margin band. In this way a sufficiently high margin band film can be formed so as to fill the region to a sufficient thickness of the liquid etching resist material.

(5) The surface of the electrode film is subjected to a lyophilic process prior to the liquid repellency process, to set the contact angle, for example, to 10 degrees. Thus, since the contact angle of the electrode film surface is the same relative to liquid etching resist material when starting the liquid repellency process, shifting of the contact angle within the electrode film surface is prevented after the liquid repellency process. At the same time, shifting of the contact angle of the electrode film surface relative to the liquid etching resist material after the liquid repellency process between different wafer substrates is also prevented.

(6) A lyophilic process is performed to set the contact angle relative to water at, for example, 10 degrees before the droplets of etching resist material are discharged into the region circumscribed by the margin band film, and the liquid etching resist material fills the region circumscribed by the margin band film. There is excellent wetting since the droplets are applied to the surface at a contact angle relative to water of less than 30 degrees, and the liquid etching resist material fills the region circumscribed by the margin band film 7a without gaps. Furthermore, the liquid etching resist material provides excellent wetting and attains a planar shape such that the surface of the etching resist film is flatter.

(7) Since a liquid repellency process is performed before the droplets of the anodic oxidation resist material are discharged and fill the margin parts of the regions 59a and 59b which include the connecting lands 57a and 57b, the electrode forming surface of the wafer substrate is adjusted to a contact angle relative to water of, for example, 80 degrees when forming the margin band. In this way a sufficiently high margin band film can be formed so as to fill the region to a sufficient thickness of the liquid anodic oxidation resist material.

(8) A lyophilic process is performed on the electrode forming surface of the wafer substrate before the liquid repellency process to set the contact angle relative to water at, for example, 10 degrees. Thus, since the contact angle of the electrode forming surface of the wafer substrate is the same relative to liquid anodic oxidation resist material when starting the liquid repellency process, shifting of the contact angle within the wafer substrate surface is prevented after the liquid repellency process. At the same time, shifting of the contact angle of the wafer substrate surface relative to the liquid etching resist material after the liquid repellency process between different wafer substrates is also prevented.

(9) A lyophilic process is performed to set the contact angle relative to water at, for example, 10 degrees before the droplets of anodic oxidation resist material are discharged into the region circumscribed by the margin band film, and the liquid anodic oxidation resist material fills the region circumscribed by the margin band film. There is excellent wetting since the droplets are applied to the surface at a contact angle relative to water of less than 30 degrees, and the liquid anodic oxidation resist material fills the region circumscribed by the margin band film without gaps. Furthermore, the liquid anodic oxidation resist material provides excellent wetting and attains a planar shape such that the surface of the anodic oxidation resist film is flatter.

A third embodiment of the film pattern forming method of the present invention is described below. In the present embodiment, the method for forming an insulation film on a circuit board is described. The droplet discharge method, droplet discharge device, liquid repellency process and lyophilic process of the present embodiment are basically identical to the droplet discharge method, droplet discharge device, liquid repellency process and lyophilic process of the first embodiment.

Figure 13:
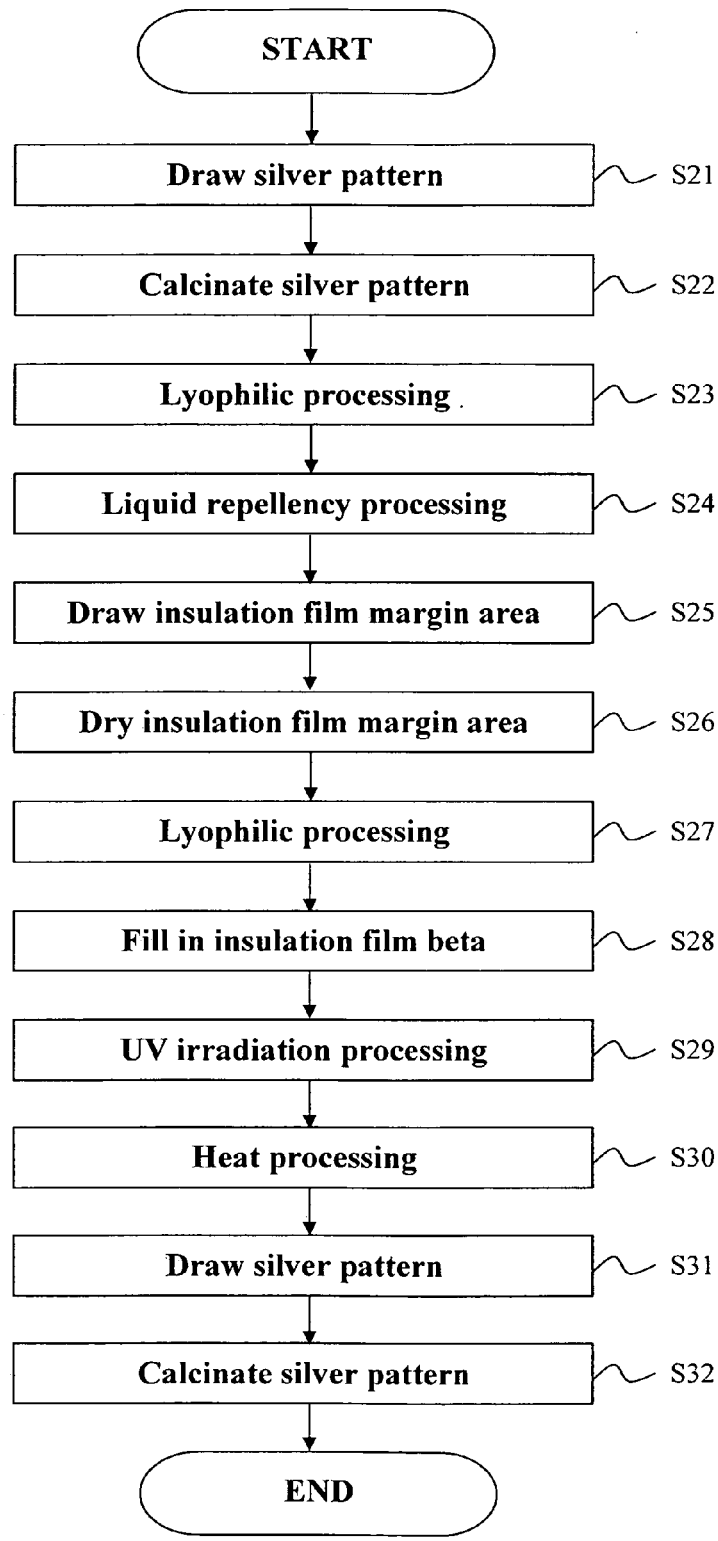
FIG. 13 is a flow chart showing an example of the process for forming the circuit board.
Figure 14:
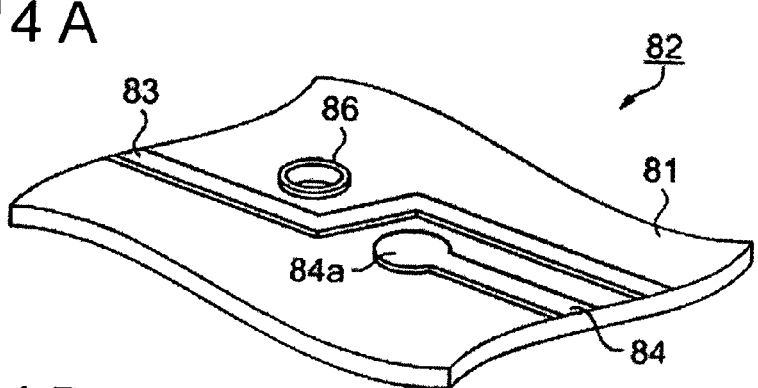
FIG. 14 are partial schematic views of the circuit board showing an example of the process for forming the circuit board.
Figure 14:
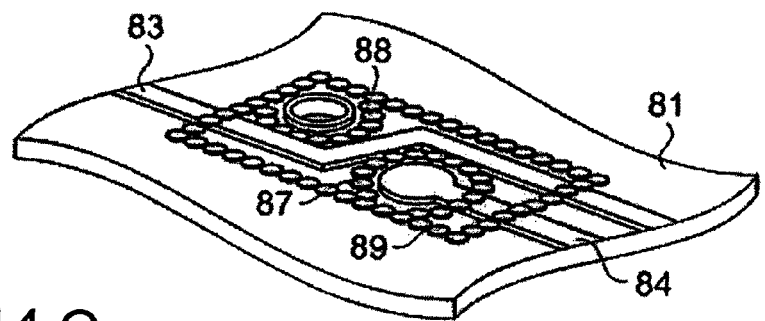
Figure 14:
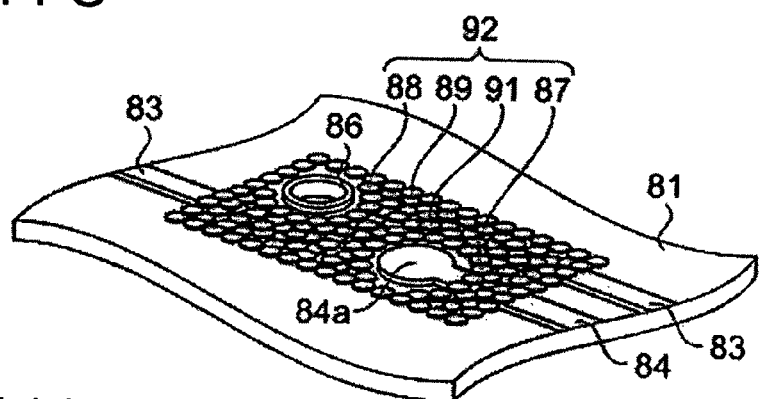
Figure 14:
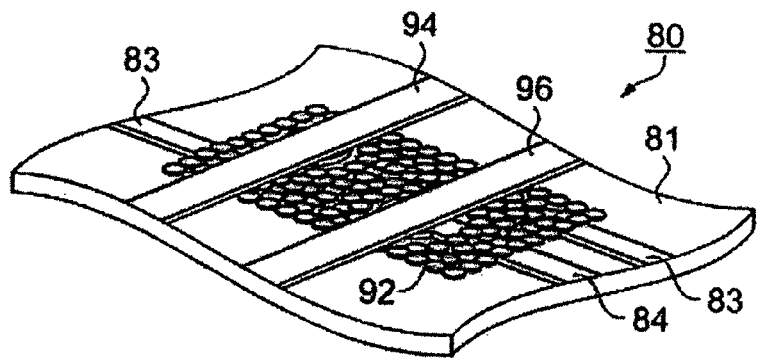

A circuit board (refer to FIG. 14D) 80 of the present embodiment is provided with an insulation film on the circuit board of the two-sided substrate 82 (refer to FIG. 14A), with a three-layer lead pattern. FIG. 13 is a flow chart showing an example of the process for forming the circuit board. FIG. 14 is a partial schematic view of a circuit board showing an example of the process for forming a circuit board of the present invention.

First, a two-sided substrate 82 is formed with circuit leads 83 and 84, and through hole 86 including lands formed on a substrate 81, as shown in FIG. 14A. A land 84a is formed at one end of the circuit led 84. The through hole 86 is connected to a circuit led including a first led pattern (not shown in the drawing) formed on the surface on the opposite side from the surface on which the circuit led 83 is formed on the substrate 81. The lead pattern including the circuit leads 83 and 84 is designated the second lead pattern.

In step S21 in FIG. 13, liquid conductive material is discharged to the land part of the through hole 86 and the circuit leads 83 and 84, to draw a lead pattern shape. The discharge method is described in the first embodiment based on FIGS. 1 and 2. The liquid conductive material is a suitable material, for example, Ag, Al, Au, Cu, palladium, Ni, W—Si, conductive polymer and the like.

In step S22, a calcination process is performed after a drying process as necessary. The drying process is performed to remove dispersion medium and ensure film thickness, for example, a substrate P may be heated on a normal hotplate, electric heater, or lamp annealed. In the case of an organic silver compound, the dried film after the drying process must be heat treated for conductivity, and the organic component of the organic silver compound removed to have residual silver particles. Therefore, a calcination process by thermal treatment or light treatment is performed on the substrate after the discharge process. A first led pattern, which is omitted from the drawing, can also be formed by executing the same processes as steps S21 and S22.

In step S23, a lyophilic process is performed on the surface of the two-sided substrate 82 on the side on which the circuit leads 83 and 84, and the land of the through hole 86 are formed, to set the contact angle relative to water at a fixed value in a range from 0 to 10 degrees, for example, 10 degrees. In step S24, a liquid repellency process is performed on the surface of the two-sided substrate 82 set a contact angle relative to water of, for example, 10 degrees, to adjust the contact angle of the surface of the two-sided substrate 82 relative to water to 60 degrees or higher, for example, 80 degrees.

In step S25, droplets of a liquid insulation film material are discharged at the margin part of the region for forming the insulation film 92 (refer to FIG. 14C), as shown in FIG. 14B to draw the margin parts of the insulation film 92. The margin parts include a land margin 87 for forming an open hole so as to not cover the land 84a, hole margin 88 for forming a closed hole so as to not cover the through hole 86, and a perimeter margin 89 of the insulation film 92.

In step S26, a drying process is performed when a slow drying liquid insulation film material is used and the land margin 87, hole margin 88, and perimeter margin 89 have not dried sufficiently to perform the next step. The and margin 87, hole margin 88, and perimeter margin 89 correspond to the margin band film.

In step S27, the surface of the two-sided substrate 82 is subjected to a lyophilic process on the side on which the land margin 87, hole margin 88, and perimeter margin 89 are formed, and the contact angle of the surface of the two-sided substrate 82 relative to water is adjusted to less than 30 degrees, for example, 10 degrees.

In step S28, a fill-in part 91 of the insulation film 92 is drawn. As shown in FIG. 14C, the fill-in part 91 is drawn by discharging the droplets of liquid insulation film material to fill the regions circumscribing the land margin 87, hole margin 88, and perimeter margin 89. The insulation film 92 is formed by the land margin 87, hole margin 88, perimeter margin 89, and fill-in part 91. Although the liquid material forming the fill-in part 91 has been drawn in a granular shape in order to display the filled state by the discharged droplets in FIG. 14C, the applied droplets become integratedly unified such that the fill-in part 91 is a single film of uniform thickness.

In step S29, the insulation film 92 is irradiated by ultraviolet light, and in step S30, is subjected to a heating process. The dried and hardened insulation film 92 is formed by steps S29 and S30.

In step S31, liquid conductive material is discharged to draw the lead pattern shape similar to step S22. In step S32, a calcination process is performed after a drying process if required, similar to step S22. A third lead pattern, which includes the circuit leads 94 and 96, is formed by the execution of the processes of steps S31 and S32, as shown in FIG. 14D. The circuit lead 94 is connected to the through hole 86 by the opening circumscribed by the hole margin 88, and the circuit lead 83 is insulated by the insulation film 92. The circuit lead 96 is connected to the land 84a by the opening circumscribed by the land margin 87, and the circuit lead 83 is insulated by the insulation film 92. When step S32 is executed, the three-layer lead pattern is formed and the process for forming the circuit substrate 80 ends.

The third embodiment provides the following effects.

(1) The liquid insulation film material for forming the fill-in part 91 is prevented from flowing through the through hole 86 by the formation of the hole margin 88. Accordingly, it is possible to form the insulation film directly next to the through hole 86, and the insulation film 92 for covering the circuit lead 83 can be formed without covering the mutually adjacent through hole 86 and through hole 86 in the circuit lead 83.

(2) The liquid insulation film material for forming the fill-in part 91 is prevented from covering the land 84a by forming the land margin 87. Accordingly, it is possible to form the insulation film directly next to the land 84a, and the insulation film 92 for covering the circuit lead 83 can be formed without covering the mutually adjacent land 84a and land 84a in the circuit lead 83.

(3) The liquid repellency process is performed before the droplets of liquid insulation material are discharged to positions forming the land margin 87, hole margin 88, and perimeter margin 89, and the surface of the two-sided substrate 82 is adjusted to a contact angle relative to water of, for example, 80 degrees when forming the margins. In this way a sufficiently high margin can be formed so as to fill the region to a sufficient thickness of the liquid insulation film material.

(4) The surface of the two-sided substrate 82 is subjected to a lyophilic process before executing the liquid repellency process, and the contact angle relative to water is set at, for example, 10 degrees. Thus, since the contact angle of the surface of the two-sided substrate 82 is the same relative to the liquid insulation film material when starting the liquid repellency process, shifting of the contact angle within the surface of the two-sided substrate 82 is prevented after the liquid repellency process. At the same time, shifting of the contact angle of the surface of the two-sided substrate 82 relative to the liquid insulation film material after the liquid repellency process is also prevented between different two-sided substrates 82.

(5) A lyophilic process is performed before droplets of the insulation film material are discharged within the region circumscribed by the margin, and the liquid insulation film material fills the region circumscribed by the margin to set the contact angle relative to water at, for example, 10 degrees. There is excellent wetting since the droplets are applied to the surface at a contact angle relative to water of less than 30 degrees, and the liquid insulation film material fills the region circumscribed by the margin without gaps. Furthermore, the liquid insulation film material provides excellent wetting and attains a planar shape such that the surface of the fill-in part 91 of the insulation film 92 is flatter.

A liquid crystal display device is described below as an example of the electro-optic device of the present invention. The liquid crystal display device of the present embodiment is provided with a thin film transistor (TFT) having an insulation film formed using the thin film pattern forming method described in the first embodiment. The droplet discharge method, droplet discharge device, liquid repellency process and lyophilic process of the present embodiment are basically identical to the droplet discharge method, droplet discharge device, liquid repellency process and lyophilic process of the first embodiment.

Figure 15:
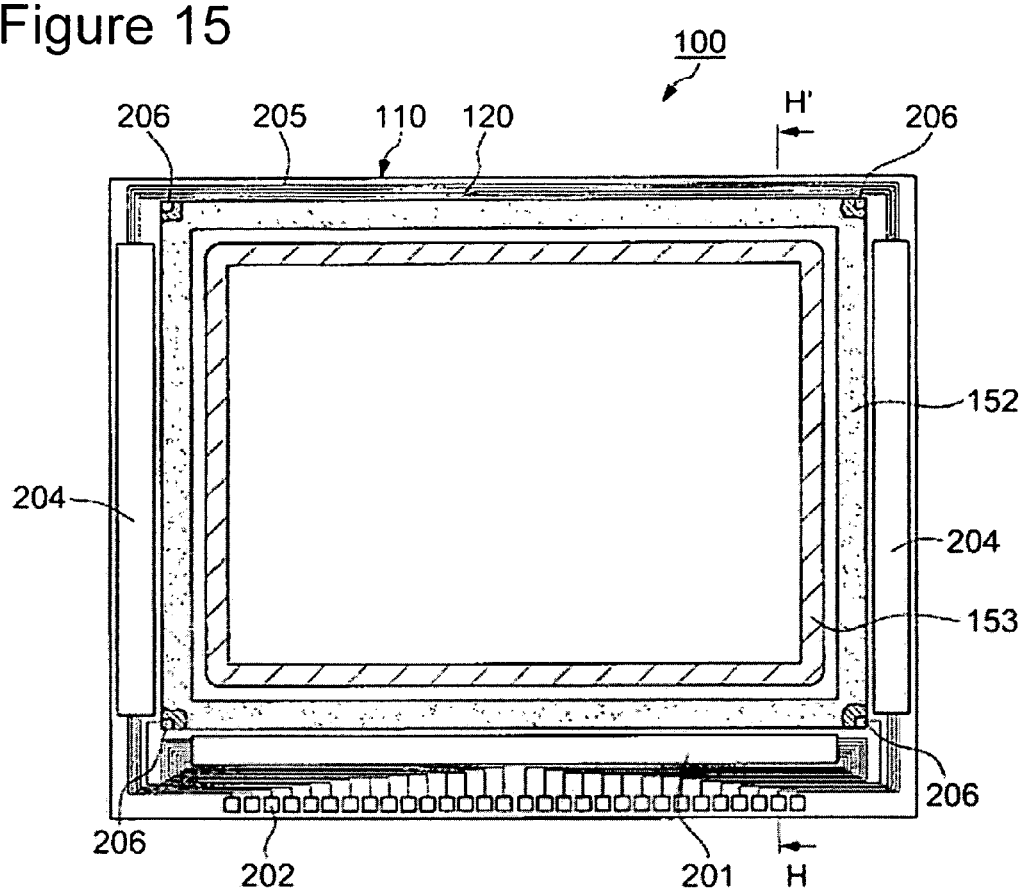
FIG. 15 is a plan view of the liquid crystal display device viewed from the opposed substrate side.
Figure 16:
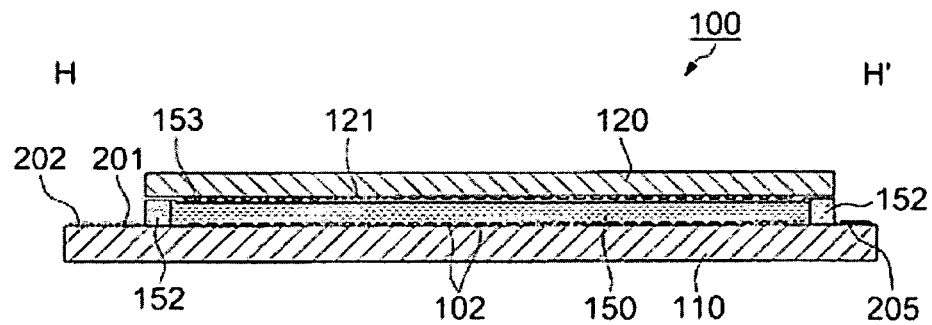
FIG. 16 is a cross section view of the liquid crystal device along the H-H' line of FIG. 15.
Figure 17:
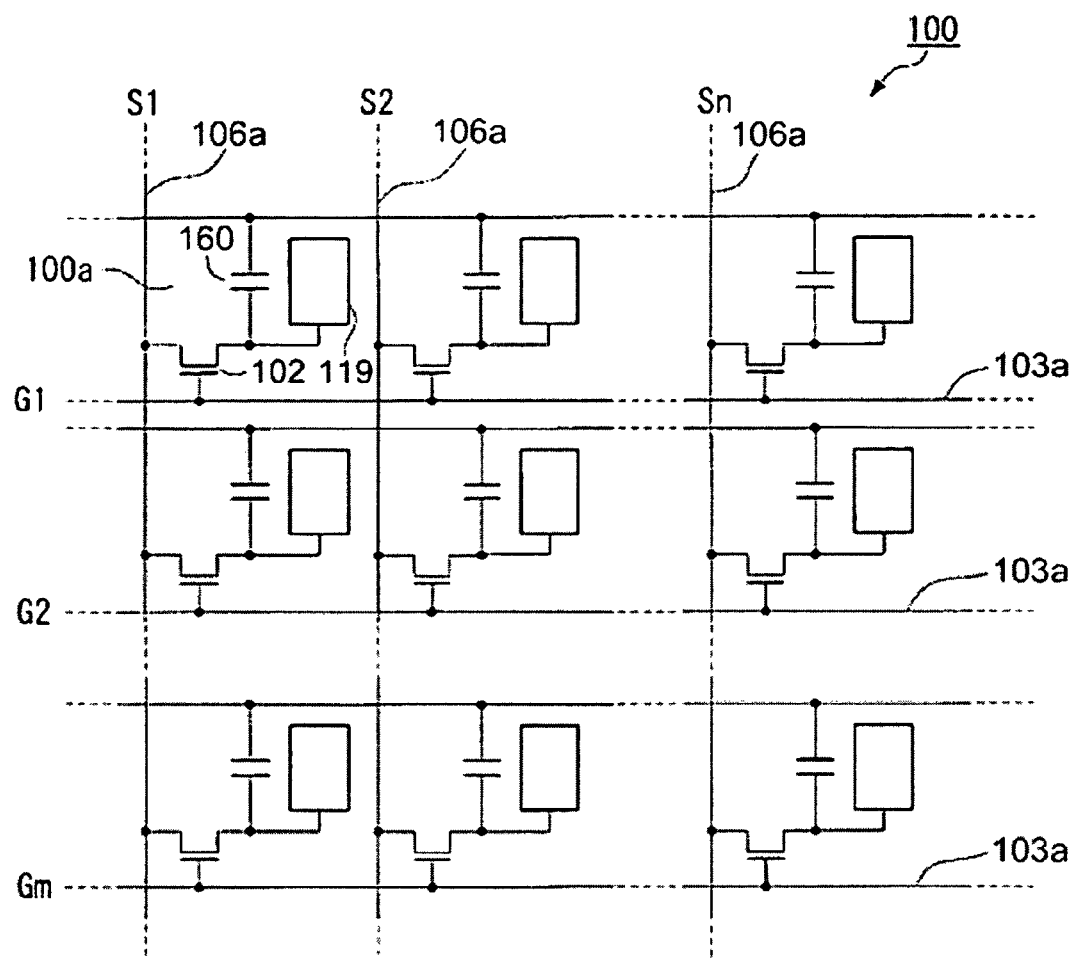
FIG. 17 is an equivalent circuit diagram of the various elements and leads in the image display region of the liquid crystal display device.
Figure 18:
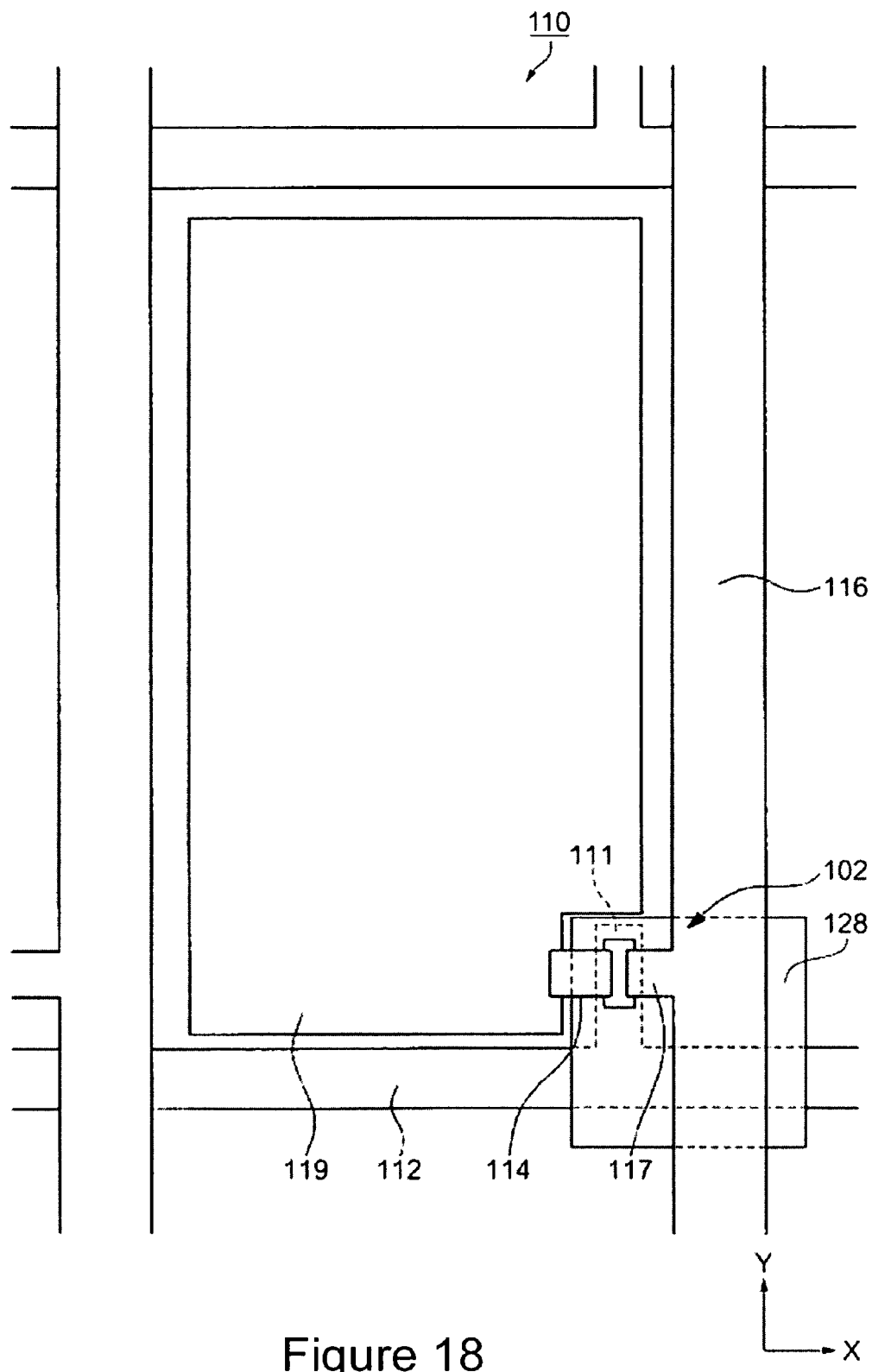
FIG. 18 is an enlarged plan view of the pixel area of the liquid crystal display device.

FIG. 15 is a plan view showing each structural element of the liquid crystal display device of the present embodiment viewed from the opposed substrate side, and FIG. 16 is a cross section view along the H-H' line of FIG. 15. FIG. 17 is an equivalent circuit diagram of each element and lead in a plurality of pixels formed in a matrix in the image display region of the liquid crystal display device, and FIG. 18 is an enlarged plan view of the pixel area of the liquid crystal display device. In each drawing used in the following description, the scale of the layers and parts is enlarged to facilitate recognition of the layers and parts in the drawings.

In FIGS. 15 and 16, the liquid crystal display device (electro-optic device) 100 of the present embodiment has an unpaired TFT array substrate 110 and opposing substrate 120 adhered by a photosetting seal member 152, such that the liquid crystal 150 is sealed and supported within a region sectioned by the seal member 152. The seal member 152 forms a closed frame in a region within the substrate surface. A plurality of pixels 100a (refer to FIG. 17) configure the surface opposite the liquid crystal 150 sealed in the TFT array substrate 110, and pixel-switching thin film transistors (TFT) 102 are formed for each pixel 100a. The TFT 102 corresponds to the semiconductor device. A plurality of common electrodes 121 are formed so as to oppose the pixels 100a on the surface opposite the liquid crystal 150 sealed in the opposed substrate 120.

A perimeter parting 153 of light-blocking material is formed at the region on the interior side of the seal member 152 forming region. A data line drive circuit 201 and mounting terminal 202 are formed along one side of the TFT array substrate 110 in the region on the outer side of the seal member 152, and scan line drive circuits 204 are formed along two sides adjacent to the aforesaid side. A plurality of leads 205, which are for connecting between the scan line drive circuits 204 provided on bilateral sides of the image display region, are provided on the remaining side of the TFT array substrate 110. Furthermore, intersubstrate conductors 206 are provided at least one location at the corners of the opposed substrate 120 for electrical conduction between the TFT array substrate 110 and opposed substrate 120.

An alternative to forming the data line drive circuit 201 and scan line drive circuits 204 on the TFT array substrate 110, is, for example, electrically and mechanically connecting tape automated bonding (TAB) substrate with mounted drive LSI and terminal groups formed on the perimeter of the TFT array substrate 110 through anisotropic conductive film. Arranged in predetermined directions in the liquid crystal display device 100 are various types of liquid crystal 150, that is, different operating modes such as twisted nematic (TN) mode, super twisted nematic (STN) mode and the like, and phase differential panels and polarization panels and the like individually corresponding to normal white mode/normal black mode (not shown in the drawings). When configuring the liquid crystal display device 100 as a color display, color filters, for example, red (R), green (G), blue (B) and their protective films are formed in opposed substrate 120 opposite each pixel electrode described later of the TFT array substrate 110.

A plurality of the previously described pixels 100a are arranged in the image display region of the liquid crystal display device 100 of the aforesaid configuration. As shown in FIG. 17, a plurality of pixels 100a are configured in a matrix in the image display region, and pixel-switching TFT (switching elements) 102 are formed for each pixel 100a; the data line 106a for supplying pixel signals S1, S2, ... Sn, are electrically connected to the source of the TFT 102. The pixel signals S1, S2, ... Sn written to the data line 106a may be supplied sequentially in the line sequence order, or may be supplied to each group of a plurality of similar adjacent data lines 106a. Furthermore, the scan line 103a is electrically connected to the gate of the TFT 102, and pulsed scan signals G1, G2, ... Gm are sequentially supplied in the scan line order to the scan lines 103a.

Pixel electrodes 119 are electrically connected to the drain of the TFT 102, and pixel signals S1, S2, ... Sn supplied from the data line 106a are written to each pixel with a predetermined timing by switching ON the switching element TFT 102 at fixed periods. Thus, the pixel signals S1, S2, ... Sn written at predetermined levels to the liquid crystal through the pixel electrode 119 are saved a fixed period between the common electrodes 121 of the opposite electrode 121 of the opposite substrate 120 shown in FIG. 16. In order to prevent the saved pixel signals S1, S2, ... Sn from leaking, an accumulator 160 with a capacity parallel to the liquid crystal capacity is formed between the common electrodes 121 and the pixel electrode 119. For example, the voltage of the pixel electrode 119 is saved by the accumulator 160 for up to three units longer than the time the source voltage is applied. Thus, the charge holding properties are improved, and a high contrast ratio liquid crystal display device 100 can be realized.

Figure 19:
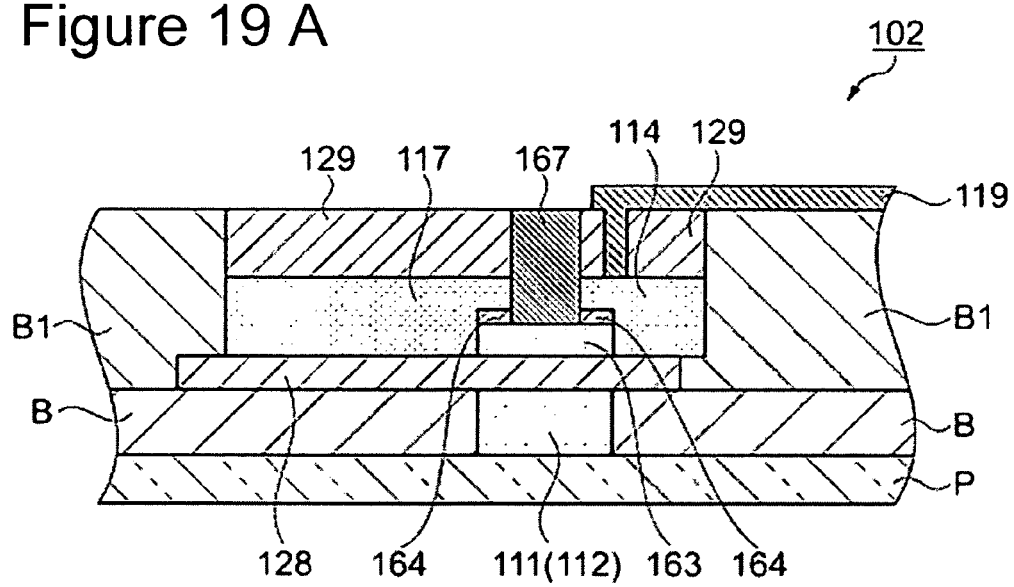
FIG. 19A is a cross section view of a TFT.
FIG. 19B is a cross section view of the area of planar intersection of the gate lead and source lead.
Figure 19:
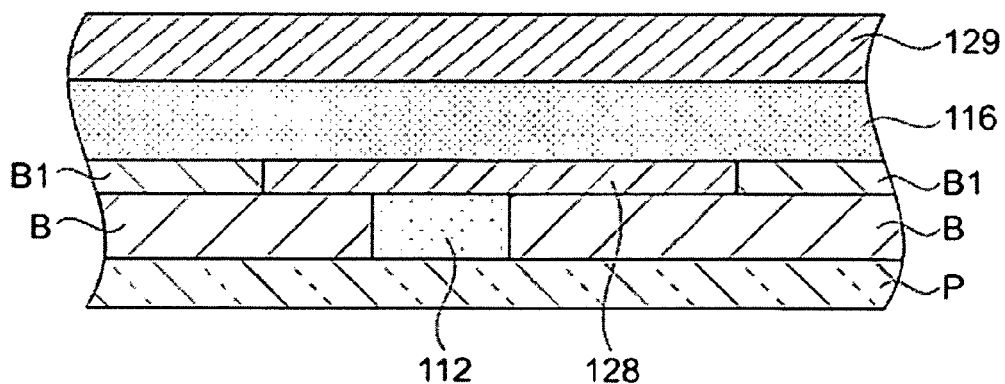

The TFT 102 is described below as an example of the semiconductor device. FIG. 18 is a plan view briefly showing the structure of a part including a single TFT of the TFT array substrate. FIG. 19 is a cross section view of the vicinity of the TFT of the TFT array substrate shown in FIG. 18, FIG. 19A is a cross section view of the TFT, and FIG. 19B is a cross section view of the part of the planar intersection of the gate lead and source lead.

As shown in FIG. 18, The top of the TFT array substrate 110 with TFT 102 is provided with a gate lead 112, source lead, 116, drain electrode 114, and pixel electrode 119 electrically connected to the drain electrode 114. The gate lead 112 extends in the X-axis direction, and part extends in the Y-axis direction. The part of the gate lead 112 extending in the Y-axis direction is used as a gate electrode 111. The width of the gate electrode 11 is narrower than the width of the gate lead 112. The source lead 116 extends in the Y-axis direction, and part extends in the X-axis direction and this part is used as a source electrode 117. An insulation film 128 is formed between the gate lead 112 and gate electrode 111, source lead 116 and source electrode 117, and drain electrode 114. The insulation film 128 corresponds to the insulation film and the film pattern.

As shown in FIG. 19, the gate lead 112 and gate electrode 111 are formed between banks B. An insulation film 128 is formed on the gate led 112, gate electrode 111, and bank B; and superimposed on the insulation film 128 are an active layer 163, which is a semiconductor layer, source lead 116, source electrode 117, and drain electrode 114. The active layer 163 is provided at a position opposite the gate electrode 111, and the part of the active layer 163 opposite the gate electrode 111 is designated a channel region. Laminated over the active layer 163 are a bank 167, and cemented layers 164 at two locations mutually insulated; the source electrode 111 and drain electrode 114 are cemented to the active layer 163 through the respective cemented layers 164. The source electrode 117 and drain electrode 114 are mutually insulated by the bank 167 provided on the active layer 163. The cemented layers 164 at two locations are mutually insulated by the bank 167 provided on the active layer 163. The gate lead 112 is insulated from the source lead 116 by the insulation film 128, and the gat electrode 111 is insulated from the source electrode 117 and drain electrode 114 by the insulation film 128. The source lead 116, source electrode 117, and drain electrode 114 are covered by an insulation film 129. A contact hole is formed in the part of the insulation film 129 covering the drain electrode 114, and the pixel electrode 119 connected to the drain electrode 114 through the contact hole is formed on the top surface of the insulation film 129.

The insulation film 128 is formed in a planar shape as shown in FIG. 16, after the gate lead 112 and gate electrode 111 have been formed in the channel of the bank B. The method for forming the insulation film 128 is the method of the first embodiment based on FIGS. 1 and 2.

First, a lyophilic process is performed on the surface of the substrate P on which the gate lead 112 and gate electrode 111 have been formed, and the contact angle relative to water is set at a fixed value in a range from 0 to 10 degrees, for example, 10 degrees. Then, the surface that has a contact angle relative to water of, for example, 10 degrees, is subjected to a liquid repellency process to mitigate the lyophilic property, and render the surface liquid repellent (refer to FIG. 2B). The contact angle of the surface of the substrate P is desirably large, a contact angle relative to water of 60 degrees or higher is preferred, and 80 degrees or higher is ideal in order to form a margin band film of sufficient height to fill the region circumscribed by the margin band film with liquid insulation film material of sufficient thickness. In the process for performing the liquid repellency process of the present embodiment, the contact angle relative to water is set, for example, at 80 degrees.

Then, droplets of the liquid simulation film material are discharged from the droplet discharge head 3 (refer to FIG. 3) and are applied to the margin part of the region for forming the insulation film 128, so as to form a margin band film of insulation film material. As described in the first embodiment, a drying process is performed according to the drying time characteristics of the liquid insulation film material.

Then, the surface of the substrate P with the margin band film formed thereon is subjected to lyophilic processing to make the surface of the substrate P lyophilic. In order to have excellent wetting by the droplets, the contact angle of the surface of the substrate P is preferably small at a contact angle relative to water of less than 30 degrees, and preferably less than 10 degrees. In the process for performing the lyophilic process of the present embodiment, the contact angle relative to water is set, for example, at 10 degrees. The process for executing the lyophilic process corresponds to the lyophilic process.

Next, droplets of the liquid insulation film material are discharged to the region circumscribed by the margin band film, and the region is filled by the liquid insulation film material. The liquid insulation film material is dried to form an insulation film 128. When a fast drying liquid insulation film material is used, a drying process is unnecessary insofar as the film having an insulation effect is formed with sufficient drying prior to the next process.

In the present embodiment, the TFT 102 is used as a switch element for driving the liquid crystal display device 100, however, the TFT 102 also may be applied to other display devices such as, for example, an organic EL (electroluminescense) display device. Organic EL display devices are elements that have a structure that interposes a thin film containing fluorescent inorganic or organic compounds between a cathode and anode, generates excitons by injecting electrons and holes and inducing rebonding in the thin film, and emits light (fluorescent light, phosphorescent light) when the excitons become inactivated. A spontaneous full color EL device can be manufactured by using as liquid materials a material for forming a light-emitting layer, that is a material capable of emitting red, green, and blue light, and a material for forming an hole injection/electron transport layer among fluorescent materials used in organic EL display elements and patterning these materials on a substrate provided with the previously described TFT 102. Organic EL devices are included within the scope of the device (electro-optic device) of the present invention.

In addition to what has been previously described, the device (electro-optic device) of the present invention is applicable to surface conduction type electron emission elements and the like that use the electron emission phenomenon by supplying a current in parallel to a plasma display panel (PDP), and the surface of a thin film having a small surface area formed on a substrate.

The fourth embodiment provides the following effects.

(1) Liquid insulation film material is prevented from flowing from a predetermined insulation film forming region and wetting outside the region, and the overlapping parts of the gate lead 112 and gate electrode 111, source lead 116 and source electrode 117, and drain electrode 114 are accurately covered by an insulation film 128 having a thickness that provides sufficient insulation effect.

(2) Liquid insulation film material is prevented from flowing from a predetermined insulation film forming region and wetting outside the region, and forming an insulation film 128 is prevented in regions where it is undesirable to form the insulation film adjacent to the insulation film forming region so as to allow passage of light.

(3) A liquid repellency process is performed before the droplets of insulation film material are discharged at the position for forming the margin of the insulation film 128, and the surface of the substrate P is adjusted to a contact angle relative to water of, for example, 80 degrees when forming the margin. In this way a sufficiently high margin can be formed so as to fill the region to a sufficient thickness of the liquid insulation film material.

(4) The surface of the substrate P is subjected to a lyophilic process before executing the liquid repellency process, and the contact angle relative to water is set at, for example, 10 degrees. Since the contact angle of the surface of the substrate P relative to the liquid insulation film material is essentially same when starting the liquid repellency process, this prevents dispersion of the contact angle in the surface of the substrate P after the liquid repellency process. At the same time, the contact angle of the surface of the substrate P relative to the liquid insulation film material after the liquid repellency process is prevented from shifting between different substrates P.

(5) A lyophilic process is performed before droplets of the insulation film material are discharged within the region circumscribed by the margin, and the liquid insulation film material fills the region circumscribed by the margin to set the contact angle relative to water at, for example, 10 degrees. There is excellent wetting since the droplets are applied to the surface at a contact angle relative to water of less than 30 degrees, and the liquid insulation film material fills the region circumscribed by the margin without gaps. Furthermore, the liquid insulation film material provides excellent wetting and attains a planar shape such that the surface of the insulation film 128 is flatter.

(6) An insulation film 128 is ideally provided to insulate the gate lead 112 and source lead 116, and to insulate the gate electrode 111, source electrode 117, and drain electrode 114, so as to realize a high performance TFT 102 through the ideal insulation.

(7) A high performance TFT 102 with ideal insulation is provided, so as to realize a high performance liquid crystal display device 100 through the ideal insulation.

The electronic device of a fifth embodiment is described below. The electronic device of the present embodiment is an electronic device provided with the SAW resonator described in the second embodiment, or the circuit substrate described in the third embodiment, or the liquid crystal display device described in the fourth embodiment. Specific examples of the electronic device of the present embodiment are described below.

Figure 20:
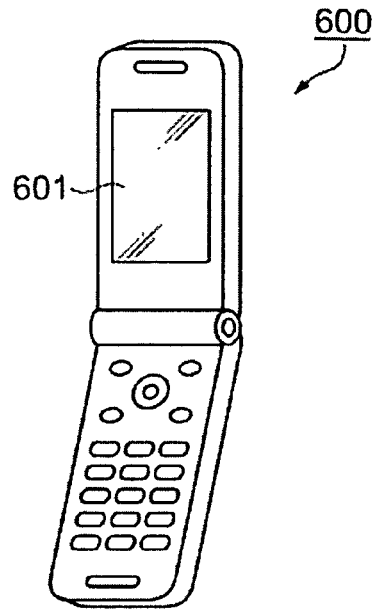
FIG. 20A is a perspective view of a portable telephone.
FIG. 20B is a perspective view of a portable information processing device.
FIG. 20C is a perspective view of a wristwatch type electronic device.
Figure 20:
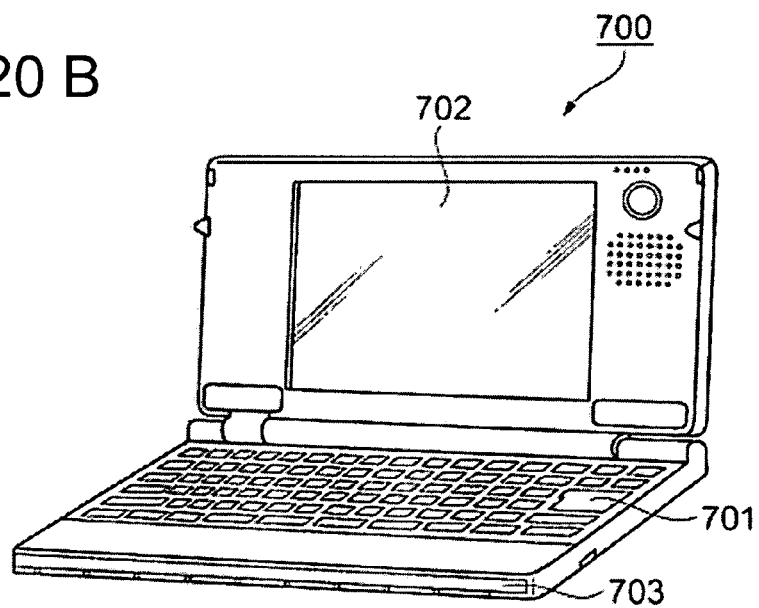
Figure 20:
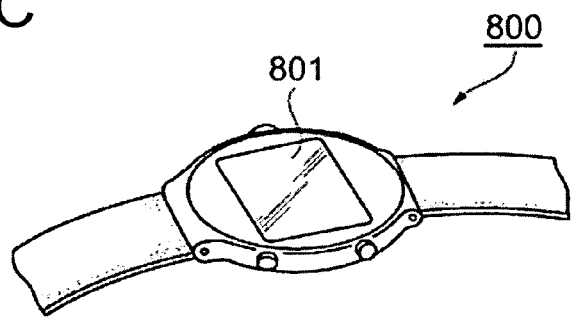

FIG. 20A is a perspective view showing an examples of a portable telephone as an example of the electronic device. In FIG. 20A, a portable telephone 600 is provided with a liquid crystal display 601 provided with the liquid crystal display device 100 described in the fourth embodiment. The circuit board described in the third embodiment is built into the portable telephone 600, and the SAW resonator described in the second embodiment is mounted on the circuit board as a communication element structural component.

FIG. 20B is a perspective view showing an example of a portable information processing device such as a word processor, personal computer and the like. In FIG. 20B a portable information processing device 700 has an information processor case 703, and is provided with an input unit 701 such as a keyboard and the like, and a liquid crystal display unit 702 provided with the liquid crystal display device 100 described in the fourth embodiment. Furthermore, the circuit board described in the third embodiment is built into the information processor case 703, and the SAW resonator described in the second embodiment is mounted on the circuit board as a timer circuit structural component.

FIG. 20C is a perspective view showing an example of a wristwatch type electronic device. In FIG. 20C, a wristwatch type electronic device 800 is provided with a liquid crystal display 801 provided with the liquid crystal display device 100 described in the fourth embodiment. The circuit board described in the third embodiment is built into wristwatch type electronic device 800, and the SAW resonator described in the second embodiment is mounted on the circuit board as a timer circuit element structural component.

The electronic devices shown in FIGS. 20A through C are provided with the liquid crystal display device 100 described in the embodiments, and are provided with the high performance TFT 102 by having a film pattern formed using a film pattern forming method capable of forming a thin film having a suitable planar shape and sufficient thickness to realize the functions of the film pattern. Although the electronic devices of the present embodiment are provided with the liquid crystal display device 100, the electronic devices can also be provided with other electro-optic devices, such as an organic electroluminescense display device, plasma type display device and the like.

The fifth embodiment provides the following effects.

(1) A high performance portable telephone 600, portable information processing device 700, and wristwatch type electronic device 800 can be realized by providing the high performance liquid crystal display device 100, circuit board 80, or SAW resonator 60 by having a film pattern formed using a film pattern forming method capable of forming a thin film having a suitable planar shape and sufficient thickness to realize the functions of the film pattern.

A sixth embodiment of the film pattern forming method of the present invention is described below. The droplet discharge method, droplet discharge device, liquid repellency process and lyophilic process of the present embodiment are basically identical to the droplet discharge method, droplet discharge device, liquid repellency process and lyophilic process of the first embodiment. Only the method for forming a margin band film different from the first embodiment is described below.

Figure 21:
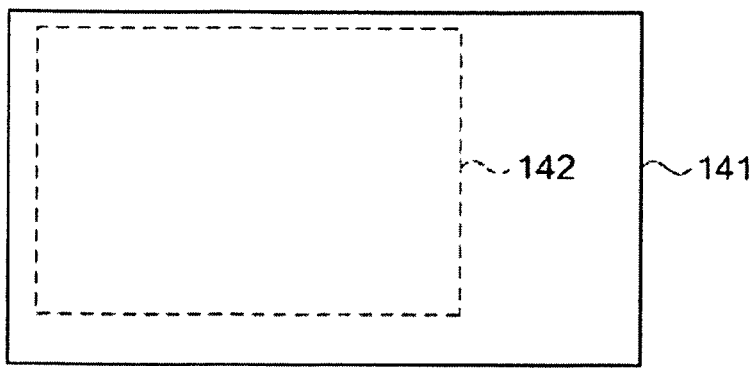
FIG. 21 are schematic plan views showing the film pattern forming method of the sixth embodiment.
Figure 21:
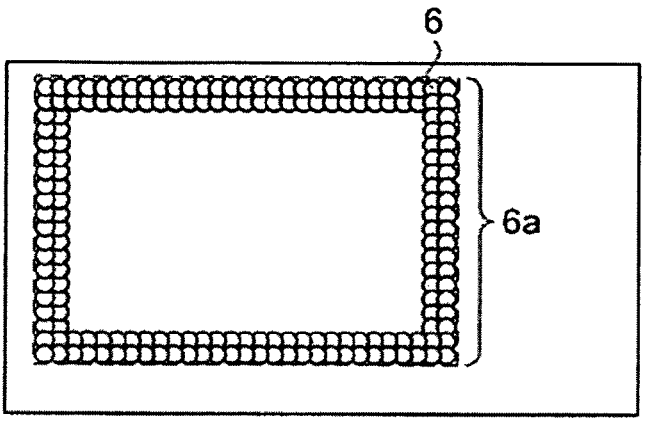
Figure 21:
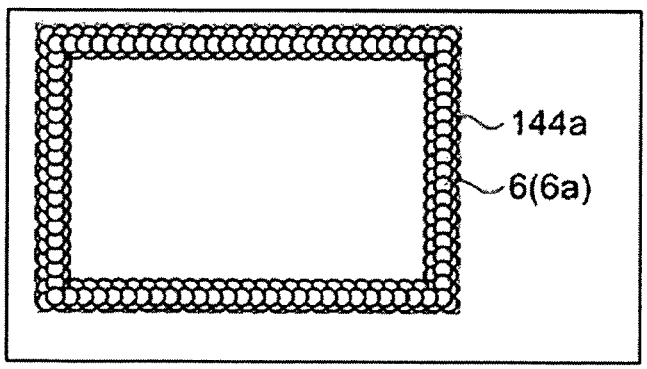
Figure 21:
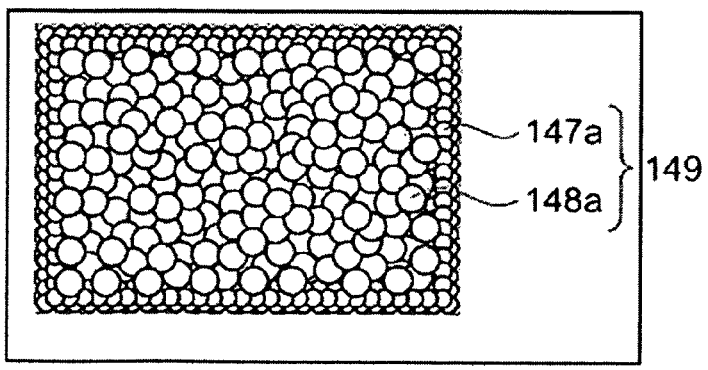
Figure 22:
FIG. 22 are schematic section views illustrating the film pattern forming method.
Figure 22:
Figure 22:
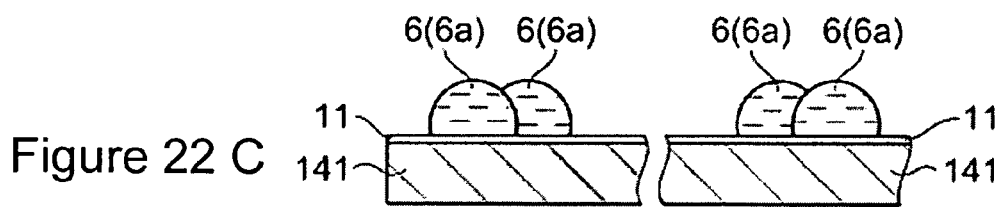
Figure 22:
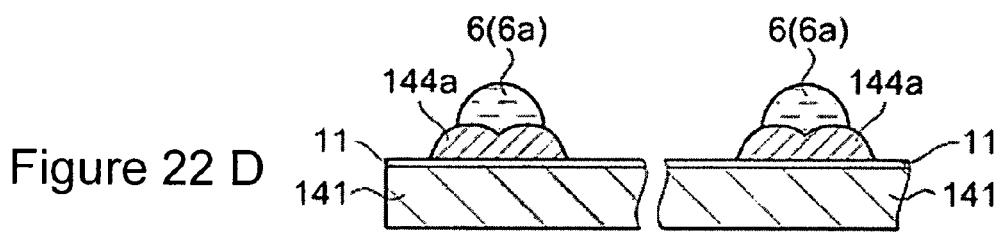
Figure 22:
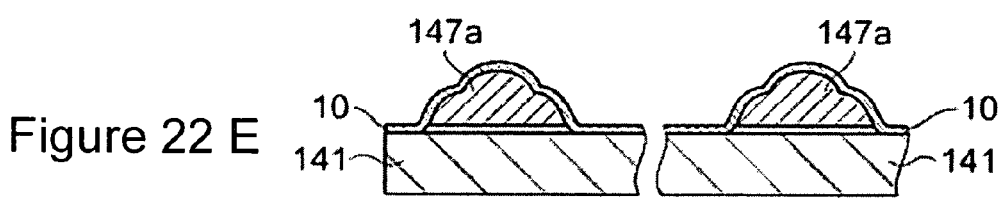
Figure 22:
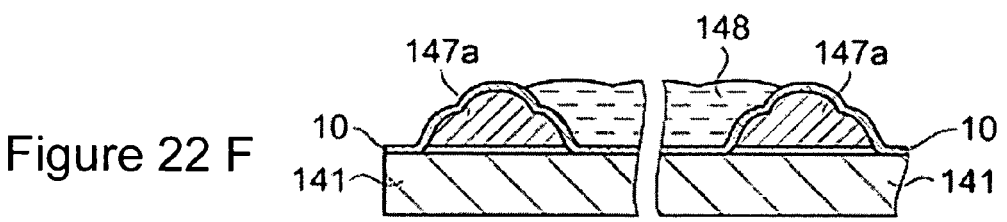
Figure 22:
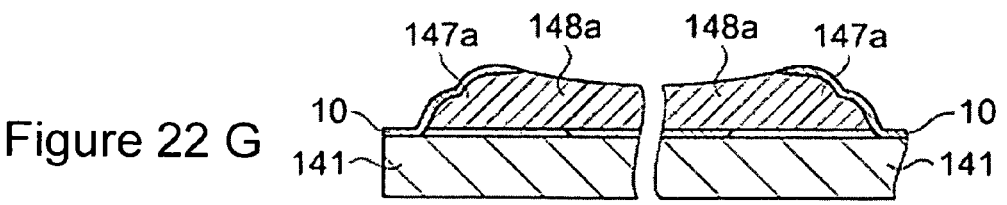

FIG. 21 is a schematic plan view showing the film pattern forming method of the present embodiment. FIG. 22 is a schematic cross section view showing the film pattern forming method of the present embodiment. A substrate 141 shown in FIG. 21 is a liquid crystal substrate of, for example, a surface elastic wave device. An example is described wherein a resist film 149 is formed in a region 142 indicated by the dashed lines in FIG. 21A. Region 142 corresponds to a margin area, and a resist film 149 corresponds to a resist film and film pattern.

First, the surface of the substrate 141 is subjected to a lyophilic process to form a lyophilic film 10 on the surface including the region 142, as shown in FIG. 22A. Then, the surface of the substrate 141 is subjected to a liquid repellency process to mitigate lyophilic property of the lyophilic film 10 and form a liquid-repelling film 11, as shown in FIG. 22B. The thickness of the lyophilic film 10 and liquid-repelling film 11 is approximately a one-molecule layer. A process for executing the lyophilic process to form the lyophilic film 10 corresponds to the preparation process, and a process for executing the liquid repellency process to mitigate the lyophilic property of the lyophilic film 10 and form the liquid-repelling film 11 corresponds to the adjustment process.

Liquid material for forming a resist film 149 is discharged as droplets 4 from the droplet discharge head 3 (refer to FIG. 2C), and the droplets 4 are applied to the surface of the substrate 141. The applied droplets 4 become droplets 6, the shape of which is regulated by the wetting characteristics of the liquid material and the surface of the substrate 141, and the droplets are arranged on the substrate 141. The droplets 6 are arranged in two rows at equal distances so as to partially mutually overlap on the margin part of the region 142, as shown in FIG. 21B. The mutually partially overlapping droplets 6 are integratedly unified as a single body, and form a band-like margin band 6a on the margin part of the region 142. Next, the margin band 6a is dried or hardened and becomes a margin band film 144a, as shown in FIG. 22D. A process of drying the margin band 6a or a process of promoting the hardening of the margin band 6a is performed when natural drying or natural hardening is slow. The process of drying the margin band 6a, and the process of hardening the margin band 6a can be performed using the same method as described in the first embodiment.

The lyophilic process and liquid repellency process are processes for shifting the contact angle (wetting) in the lyophilic direction and liquid repellency direction, and the contact angle after the process is dependent on the contact angle before the process and the lyophilic process or liquid repellency process that was performed. However, there are cases in which the contact angle may differ due to differences in the installation environment even when the substrate surface is made of identical material, and the contact angle prior to processing may differ even when the substrate surface is made of identical material. The preparation process is a process for achieving a contact angle at a fixed value prior to the adjustment process in order to shift the contact angle during the following adjustment process to attain a target contact angle. The preparation process of the present embodiment is a process for forming a lyophilic film 10, and the contact angle relative to water, for example, is set to a fixed value, for example, 10 degrees, in a range of 0 degrees to 10 degrees. The method of the lyophilic process may be the same method described in the first embodiment.

As described above; the shape of the droplet 6, which is obtained when the droplet 4 has impinged the surface of the substrate 141, is regulated by the wetting of the liquid on the surface of the substrate 141. For example, a liquid material containing 20% phenol novolac resin as a solid has a superior wetting area on a surface when the contact angle relative to water is less than 30 degrees, and the droplet 6 weighing approximately 10 nano grams wets a wide area and the droplet loses its shape and its height is difficult to measure. In order to have the shape of the droplet 6 be a shape capable of forming a higher margin band film 144a, the contact angle of the surface of the substrate 141 is preferably large, and the contact angle relative to water is preferably 60 degrees or higher, and more preferably 80 degrees or higher. In the process for forming the liquid-repelling film 11, for example, the contact angle relative to water is 80 degrees. The method of the liquid repellency process may be the same method described in the first embodiment.

As shown in FIGS. 21C and 22D, droplets 4 are arranged on a margin band film 144a, and a margin band 6a of linked droplets 6 is formed on the margin band film 144a. The margin band 6a formed so as to be laminated on the margin band film 144a gradually dries or hardens and the margin band film 144a becomes integratedly unified to form a margin band film 147a.

Next, a lyophilic process is performed on the surface of the substrate 141 on which the margin band film 147a is formed, as shown in FIG. 22E. As described above, the shape of the droplet 6, which is obtained when the droplet 4 has impinged the surface of the substrate 141, is regulated by the wetting of the liquid material on the surface of the substrate 141. For example, a liquid material containing 20% phenol novolac resin as a solid has a superior wetting area on a surface when the contact angle relative to water is less than 30 degrees, and the droplet 6 weighing approximately 10 nano grams wets a wide area and the droplet loses its shape and its height is difficult to measure. In order to obtain a better wetting area by the droplet 6 the contact angle is desirably reduced relative to the liquid material on the surface of the substrate 141, so as to be less than 30 degrees, and ideally less than 10 degrees. In the process for executing the lyophilic process to form a lyophilic film 10, the contact angle relative to water is 10 degrees. The process for executing the lyophilic process corresponds to the lyophilic process.

Next, droplets 4 are discharged within the region circumscribed by the margin band film 147a, and the droplets 6, that is, the liquid material, fills the region circumscribed by the margin band film 147a. Since the droplets 4 impinging the surface at a contact angle relative to water of less than 30 degrees produce excellent wetting, the droplets 6 are not formed in the shape shown in FIG. 22C, and a center film 148 is formed by the liquid material wetting and filling the region circumscribed by the margin band film 147a, as shown in FIG. 22F. The liquid material forming the center film 148 does not have the granular shape of the droplet 4 and wets in a flattened plate-like shape. Furthermore, the applied and flattened droplet 4 wets and spreads so as to fill the gaps between the applied and flattened droplets 4, such that the surface of the center film 148 is readily flattened.

As shown in FIGS. 21D and 22G, the applied liquid material is dried or hardened to form a center film 148a, and the resist film 149 is formed by the margin band film 147a and the center film 148a. During the time the filled liquid material is naturally dried or naturally hardened, a process may be performed to promote the drying or hardening similar to the margin band 6a. When the liquid material is solidified by drying or hardening, the thickness of the center film 148a is less than the thickness of the margin band film 147a when the volume of the liquid material is reduced.

Although the liquid material forming the center film 148a has been drawn in a granular shape in order to display the filled state of the discharged droplets 4 in FIG. 21D, the applied droplets 4 become integratedly unified such that the center film 148 is a single film of uniform thickness, and the dried or hardened center film 148a is also a single film of uniform thickness.

The sixth embodiment provides the following effects in addition to the same effects (1) through (6), (8), and (9) described in the first embodiment.

(1) The height of the margin band film 147a can be made higher since the margin band film 147a is formed by laminating the margin band 6a on the margin band film 144a. A thicker resist film 149 can be formed since more liquid material fills the region circumscribed by the margin band film 147a.

Although the preferred embodiments of the present invention have been described with reference to the accompanying drawings, the embodiments of the invention are not limited to these examples and the present invention may be variously modified insofar as the modifications do not depart from the scope of the invention, some examples of which pertain below.

(Modification 1) Although lyophilic processing and liquid repellency processing are performed before forming the margin band film so as to impart a liquid repellency to the surface on which the margin band film is formed in the above embodiments, performing the lyophilic processing and liquid repellency processing is not compulsory. The liquid repellency process may be performed alone to obtain a suitable contact angle relative to the liquid material. The lyophilic process and liquid repellency process need not be performed insofar as a suitable contact angle is formed relative to the liquid material by materials on the substrate, and the contact angle of the surface on which the margin band film is formed relative to the liquid material is a suitable contact angle. When the contact angle of the surface on which the margin band film is formed relative to water is an extremely large contact angle, the contact angle can be reduced by performing a lyophilic process to mitigate the liquid repellency.

(Modification 2) Although a lyophilic process is performed first and a subsequent liquid repellency process is performed prior to forming the margin band film in the above embodiments, performing the lyophilic process first and then performing the liquid repellency process is not compulsory. When the treated surface has a contact angle relative to the liquid material that is extremely large by initially performing a liquid repellency process, the liquid repellency may be mitigate by performing a subsequent lyophilic process to adjustably reduce the contact angle to a predetermined contact angle.

(Modification 3) Although the liquid material used to form the margin band film 7a and the liquid material used to fill the region circumscribed by the margin band 7a and form the center film 8 are the same liquid material in the above embodiments, use of the same liquid material is not compulsory. The liquid material for forming the margin band film 7a and the liquid material for forming the center film 8 may be liquid materials having respectively different viscosities. the respectively used liquid materials should be such that the viscosity of the liquid material used to form the margin band film 7a is higher than the viscosity of the liquid material used to form the center film 8.

It is desirable that a high viscosity liquid material is used to form the margin band film 7a to a height capable of being filled by liquid material to a sufficient thickness. It is desirable that a low viscosity liquid material is used to form a uniform center film 8 by uniformly the entire region with liquid material. The respectively used liquid materials should be such that the viscosity of the liquid material used to form the margin band film 7a is higher than the viscosity of the liquid material used to form the center film 8, and it is unnecessary to reduce the viscosity of the liquid material used to form the margin band film 7a to the viscosity of the liquid material used to form the uniform center film 8, such that a higher viscosity liquid material can be used compared to methods in which the margin band film 7a and center film 8 are formed by liquid materials having the same viscosity. Similarly, the liquid material used to form the center film 8 need not be increased to be used to form the margin band film 7a to a height that can be filled to sufficient thickness, and a lower viscosity liquid material may be used.

The droplets of high viscosity liquid material deform to a lesser degree while hardening after being applied than droplets of a low viscosity liquid material. A thicker margin band film 7a can be formed by droplets using a high viscosity liquid material as the liquid material for forming the margin band film 7a. In conjunction therewith, the spread range of a single droplet can be narrowed, and the irregularities of the perimeter contour of the margin band film 7a formed by the linked droplets can be reduced. The droplets of low viscosity liquid material deform to a higher degree while hardening after being applied than droplets of a high viscosity liquid material. Therefore, when lower viscosity liquid material is used to form the center film 8, the applied droplets spread easily and uniformly fill the entire region to produce a uniform center film 8.

(Modification 4) Although the droplets used to form the margin band film 7a and the droplets used to fill the region circumscribed by the margin band 7a and form the center film 8 are the same size in the above embodiments, droplets of the same size are not compulsory. The volume of the droplets used to form the margin band film 7a may be lower than the volume of the droplets used to form the center film 8.

The greater the volume, the greater the surface area wetted by the applied droplet. A smaller wetting volume reduces the irregularities on the perimeter (refer to FIG. 1B, and brings the contour of the film pattern closer to a straight line. However, a droplet of higher volume is desirable in order to more effectively fill the region with the liquid material. By having the volume of the droplets used to form the margin band film 7a lower than the volume of the droplets used to form the center film 8, the droplets forming the margin band film 7a need not be increased to higher volume to fill effectively, such that droplets of smaller volume may be used compared to methods which discharge droplets of identical volume to form the margin band film 7a and center film 8. Similarly, the droplets for forming the center film 8 need not have a reduced volume in order to prevent the droplets from spreading from the applied position, such that droplets of larger volume may be used. Thus, a suitable droplet volume for forming the margin band film 7a and suitable droplet volume for forming the center film 8 may be selected to minimize excess spreading, form a margin band film 7a having fewer irregularities of the perimeter contour shape, and effectively form a center film 8.

(Modification 5) Although a two-stage laminate layer margin band film 147a is formed by laminating a margin band 6a on a margin band film 144a to increase the height of the margin band film in the sixth embodiment, the number of laminate layers is not limited to two. A margin band film also may be formed having further laminations on top of the margin band 6a. Although the margin band film 144a is formed by two rows of droplets 6, the number of rows is not limited to two, and may be one row, or three or more rows. Although the margin band 6a laminated over the margin band film 144a is formed by a single row of droplets 6, the number of rows is not limited to one, and may be any number of rows within a range that is laminatable on the margin band film 144a.

(Modification 6) Although the droplets 6 forming the margin band film 7a are arranged at equal distances so as to mutually partially overlap at the margin area of the region 2 in the above embodiments, the mutual partial overlap of the droplets 6 is not compulsory. The margin band film 7a may be arranged so as to be mutually gapped or partially gapped insofar as the degree of gapping does not permit liquid material to flow from the gap of the margin band film 7a depending on the degree of the wetting characteristics of the liquid material of the margin band film 7a. The droplets 6 may be arranged to be mutually gapped so as to reduce the required number of discharges of the droplets 4, and reduce the time required to arrange the droplets 6 to form the margin band film 7a.

(Modification 7) Although the droplet discharge device IJ is provided with a single droplet discharge head 3 having a plurality of nozzles in the above embodiments, the droplet discharge head 3 provided in the droplet discharge device IJ is not limited to a single head. The droplet discharge device IJ may also be provided with a plurality of droplet discharge heads 3. When a plurality of droplet discharge heads 3 are provided, different liquid materials may be discharged from each droplet discharge head 3. For example, liquid material having a high surface tension may be discharged from one droplet discharge head 3 to form the margin band film 7a, and a liquid material having a low surface tension may be discharged from another droplet discharge head 3 to form the center film 8. The SAW resonator 60 and the like can be manufactured efficiently because consecutive processes may be performed to discharge different liquid materials with the substrate 1 placed in the droplet discharge device IJ.

(Modification 8) Although the film pattern forming method of the present invention is used to form the electrodes of the IDT 55, reflectors 56a and 56b, and connecting lands 57a and 57b and the like by forming an etching resist film to selectively cover the electrode film, then etching the electrode film in the above embodiments, forming the etching resist film and electrode film are not compulsory when forming the electrodes. Electrodes may also be formed by discharging the liquid material of the electrode film directly on the SAW resonating piece using the film pattern forming method of the present invention.

(Modification 9) Although the SAW resonator is a SAW resonator 60 is configured by a SAW resonating piece 51 sealed in a case 61 in the above embodiments, the SAW resonating piece 51 may be configured to include other oscillation circuits, and the SAW resonating piece 51 and oscillation circuit may be housed in the same case.

(Modification 10) Although the circuit board 80 of the above embodiments has a three-layer lead pattern by providing an insulation layer on the circuit leads of a two-sided substrate 82 on which are formed circuit leads on both sides of a plate-like substrate 81, the substrate is not limited to a plate-like substrate. A film-like substrate, such as a flexible substrate, also may be used. Furthermore, forming circuit leads on both sides of the substrate 81, and having circuit leads formable on both sides is not compulsory. The substrate may also be a glass substrate of an electro-optic device such as a liquid crystal display or the like, and the circuit board and method of manufacturing the circuit board of the present invention are applicable to electro-optic devices such as liquid crystal display devices and the like.

(Modification 11) Although a lyophilic process is performed on the surface of a substrate on which a margin band film 7a has been formed in the above embodiments, a method of selectively performing the lyophilic processing on a processing region may be used, and lyophilic processing may also be selectively performed on only those regions circumscribed by the margin band film 7a. If the margin band film 7a is liquid repellent, the liquid material filling the region circumscribed by the margin band film 7a will not readily pass the margin band film 7a, and the liquid material will more thickly fill the region circumscribed by the margin band film 7a.

Technical considerations derived from the embodiments and modifications are discussed below.

(Technical Consideration 1) A surface elastic wave device manufacturing method includes a process for forming an etching resist film using any one among the film pattern forming methods of various aspects of the present invention on a part of the surface of the surface elastic wave device that does not have a predetermined electrode pattern of a conductive film formed thereon; and a process for forming an electrode pattern on a part not covered by the etching resist film by performing an etching process on the conductive film to remove the conductive film.

(Technical Consideration 2) A surface elastic wave device manufacturing method includes a process for forming and electrode pattern using any one among the film pattern forming methods of various aspects of the present invention on the surface of the surface elastic wave device substrate.

(Technical Consideration 3) A surface elastic wave device manufacturing method includes a process for forming a resist film using any one among the film pattern forming methods of various aspects of the present invention on a part of the surface of the surface elastic wave device that is not treated with an anodic oxidation process; and a process for executing the anodic oxidation process on the surface of the surface elastic wave device.

(Technical Consideration 4) A method for manufacturing an electro-optic device includes a process for forming an insulation film to insulate between mutually conductive films, or between a conductive film and a semiconductive film using the film pattern forming method of any among various aspects of the present invention.

According to this method, a high performance electro-optic device can be realized by realizing an ideal insulation between mutually conductive films, or a conductive film and a semiconductive film since the semiconductor device forming the electro-optic device is a high performance semiconductor device realizing ideal insulation between mutually conductive films, or a conductive film and a semiconductive film. The insulation film 128 described in the fourth embodiment corresponds to the insulation film, and the gate electrode 111, gate lead 112, drain electrode 114, source lead 116, source electrode 117 and the like correspond to the conductive film, and the active layer 163 and the like correspond to the semiconductive film.

(Technical Consideration 5) The film pattern forming method described in the various aspects of the present invention wherein the process of performing a lyophilic process of the claims is a process of exposing the surface of the substrate to an ozone atmosphere.

This application claims priority to Japanese Patent Application No. 2005-024980. The entire disclosure of Japanese Patent Application No. 2005-024980 is hereby incorporated herein by reference.

What is claimed is:

1. A film pattern forming method for forming a film pattern on a predetermined region of a substrate that has a predetermined shape, comprising:
    rendering a surface of the substrate liquid-repellent;
    applying droplets of a liquid containing material for forming the film pattern on the liquid-repellent surface of the substrate thereby forming a margin band of the applied droplets and forming a margin band film by drying or hardening the margin band;
    increasing liquid affinity of the surface of the substrate and a surface of the margin band film to form a film with liquid affinity continuously over the surface of the substrate and the surface of the margin band; and
    applying droplets of the liquid containing the material for forming the film pattern in the predetermined region circumscribed by the margin band film and thereby filling the predetermined region for forming the film pattern in the predetermined region so that a thickness of the film pattern formed in the predetermined region is smaller than a thickness of the margin band film.

2. The film forming method of claim 1, wherein
the drying or hardening the margin band is performed by heating or irradiating with light the margin band.

3. The film pattern forming method of claim 1, wherein
in rendering the surface of the substrate liquid-repellent, a contact angle relative to water of the surface on which the film pattern is to be formed is made 60 degrees or more.

4. The film pattern forming method of claim 1, wherein
in increasing liquid affinity of the surface of the substrate, a contact angle relative to water of the surface on which the film pattern is to be formed is 30 degrees or less.

5. The film pattern forming method of claim 1, wherein
the rendering of the surface of the substrate liquid repellent includes:
   executing a liquid affinity process or a liquid repellency process on the surface of the substrate as a preparation process; and
   adjusting a contact angle relative to water of the surface on which the film pattern is to be formed such that the contact angle is higher than a predetermined contact angle, by executing a liquid repellency process when the liquid affinity process has been executed as the preparation process, and executing a liquid affinity process when the liquid repellency process has been executed as the preparation process.

6. The film pattern forming method of claim 5, wherein
the liquid repellency processes is a process of forming a thin organic film of organic molecules containing fluorine on the surface of the substrate.

7. The film pattern forming method of claim 5, wherein
the liquid repellency process is a process of treating the surface of the substrate with a plasma processing using a fluorocarbon compound as a reaction gas.

8. The film pattern forming method of claim 5, wherein
the liquid repellency process is a process of forming on the surface of the substrate a liquid-repelling film by applying a macromolecular compound containing fluorine.

9. The film pattern forming method of claim 5, wherein
the liquid affinity process is a process of irradiating the surface of the substrate with ultraviolet light.

10. The film pattern forming method of claim 5, wherein
the liquid affinity process is a process of treating the surface of the substrate by a plasma processing using oxygen as a reaction gas.

11. The film pattern forming method of claim 5, wherein
the liquid affinity process is a process of treating the surface of the substrate with an acid or alkali processing.

12. The film pattern forming method of claim 1, wherein
the margin band is formed of the droplets that are aligned linearly, with the droplets being in contact with each other.

13. The film pattern forming method of claim 1, wherein
the forming of the margin band and the hardening or drying of the margin band are executed a plurality of times in an alternating manner to form a laminated margin band film.

14. The film pattern forming method of claim 1, wherein
a viscosity of the liquid used in forming the margin band is higher than a viscosity of the liquid used in filling the predetermined region.

15. The film pattern forming method of claim 1, wherein
a volume per droplet applied during the forming of the margin band is less than a volume per droplet applied during the filling of the predetermined region.

16. The film pattern forming method of claim 1, wherein
the increasing of the liquid affinity of the surface of the substrate and the surface of the margin band film includes performing the same lyophilic process concurrently to the surface of the substrate and the surface of the margin band film.

* * * * *